(12) United States Patent
McPherson

(10) Patent No.: US 12,374,660 B2
(45) Date of Patent: Jul. 29, 2025

(54) POWER MODULE

(71) Applicant: Wolfspeed, Inc., Durham, NC (US)

(72) Inventor: Brice McPherson, Fayetteville, AR (US)

(73) Assignee: WOLFSPEED, INC., Durham, NC (US)

( * ) Notice: Subject to any disclaimer, the term of this patent is extended or adjusted under 35 U.S.C. 154(b) by 406 days.

(21) Appl. No.: 17/844,231

(22) Filed: Jun. 20, 2022

(65) Prior Publication Data

US 2023/0411359 A1 Dec. 21, 2023

(51) Int. Cl.
| H01L 25/07 | (2006.01) |
| H01L 23/00 | (2006.01) |
| H01L 23/31 | (2006.01) |
| H01L 23/34 | (2006.01) |
| H01L 23/367 | (2006.01) |
| H01L 23/495 | (2006.01) |

(52) U.S. Cl.
CPC ........ *H01L 25/072* (2013.01); *H01L 23/3107* (2013.01); *H01L 23/34* (2013.01); *H01L 23/3672* (2013.01); *H01L 23/49562* (2013.01); *H01L 24/37* (2013.01); *H01L 2224/37012* (2013.01)

(58) Field of Classification Search
None
See application file for complete search history.

(56) References Cited

U.S. PATENT DOCUMENTS

| 10,212,838 | B2 | 2/2019 | McPherson et al. |
| 10,405,450 | B2 | 9/2019 | McPherson et al. |
| 10,749,443 | B2 | 8/2020 | Martin et al. |
| 10,917,992 | B2 | 2/2021 | Feurtado et al. |
| 11,445,630 | B2 | 9/2022 | Feurtado et al. |
| D969,740 | S | 11/2022 | McPherson et al. |
| 11,696,417 | B2 | 7/2023 | Feurtado et al. |
| 2015/0131236 | A1 | 5/2015 | Passmore et al. |

(Continued)

FOREIGN PATENT DOCUMENTS

WO WO 2020146204 7/2020

OTHER PUBLICATIONS

International Search Report and Written Opinion for Application No. PCT/U82023/025248, mailed Dec. 4, 2023, 12 pages.

(Continued)

*Primary Examiner* — William C Trapanese
(74) *Attorney, Agent, or Firm* — Dority & Manning, P.A.

(57) ABSTRACT

A power module has a substrate having a top side with a first device pad and a second device pad. A first plurality of vertical power devices is coupled to the first device pad via first drain contacts, and a second plurality of vertical power devices is coupled to the second device pad via second drain contacts to form part of a power circuit. A housing encompasses portions of the substrate, the first plurality of vertical power devices, and the second plurality of vertical power devices. A first power terminal extends through a top surface of the housing to the first device pad. A second power terminal extends through the top surface of the housing to the source contacts on a top side of the second plurality of vertical power devices. A third power terminal extends through a top surface of the housing to the second device pad.

25 Claims, 29 Drawing Sheets

(56) References Cited

U.S. PATENT DOCUMENTS

| | | |
|---|---|---|
| 2015/0371937 A1 | 12/2015 | Yoshihara et al. |
| 2016/0353590 A1 | 12/2016 | McPherson et al. |
| 2019/0191585 A1 | 6/2019 | McPherson et al. |
| 2020/0304037 A1 | 9/2020 | Martin et al. |
| 2021/0136947 A1 | 5/2021 | Feurtado et al. |
| 2021/0313256 A1* | 10/2021 | McPherson ......... H01L 23/3121 |
| 2022/0262735 A1 | 8/2022 | Martin et al. |

OTHER PUBLICATIONS

International Preliminary Report on Patentability for Application No. PCT/US2023/025248, mailed Jan. 2, 2025, 8 pages.

* cited by examiner

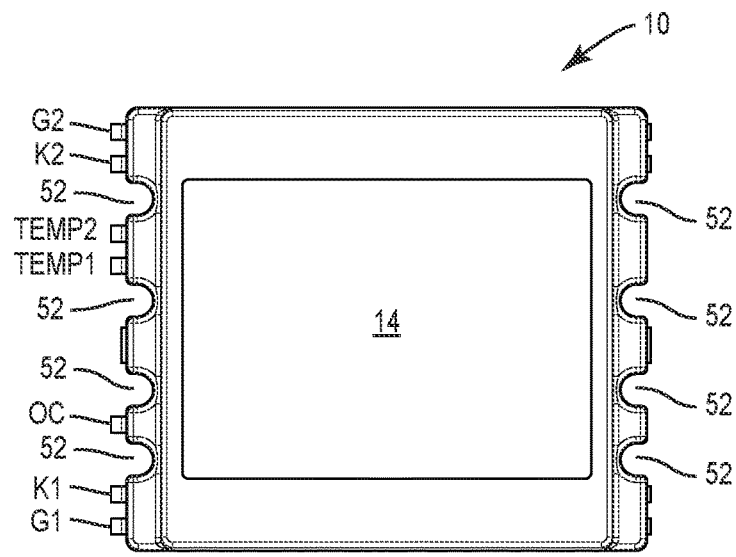
FIG. 8
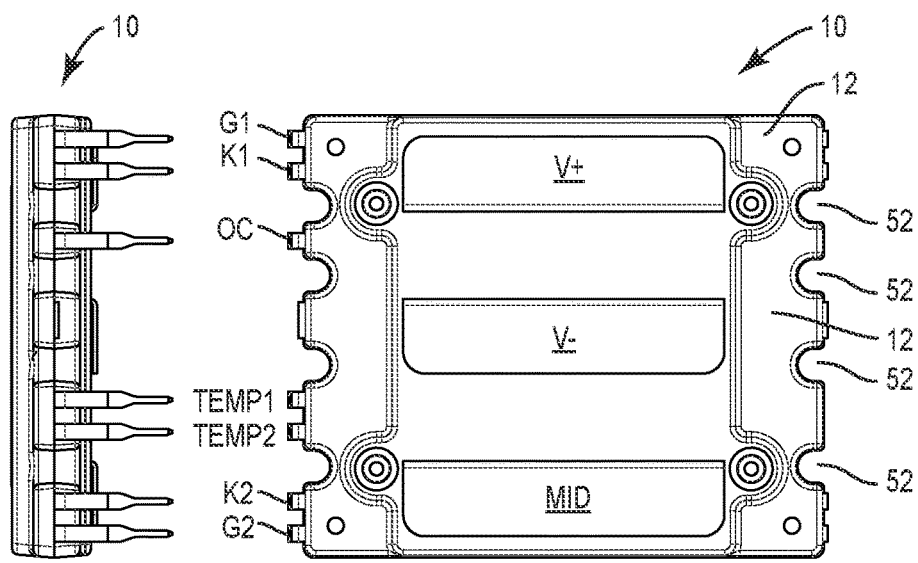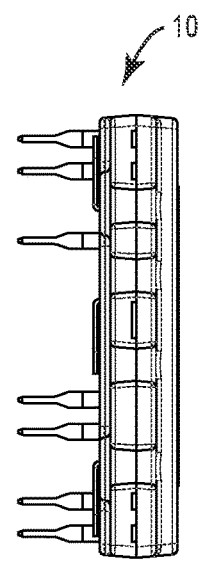
FIG. 5  FIG. 4  FIG. 7
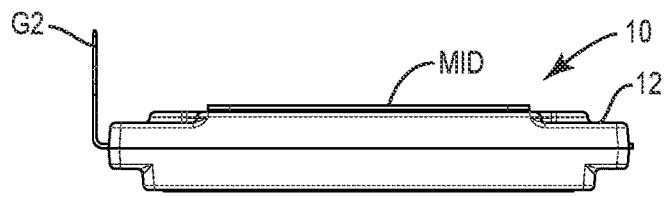
FIG. 6

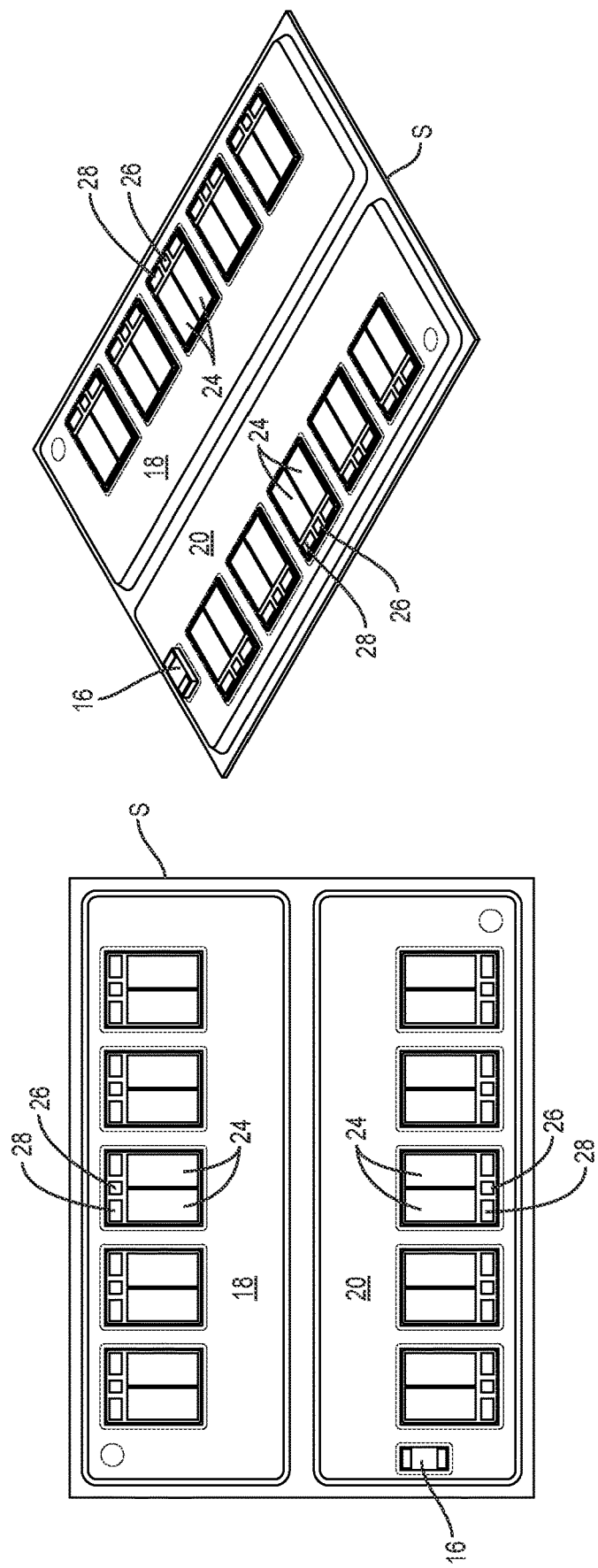

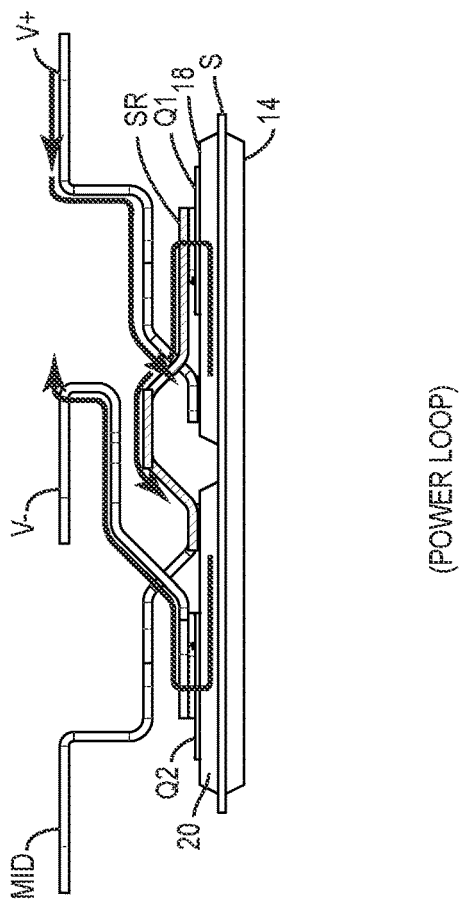
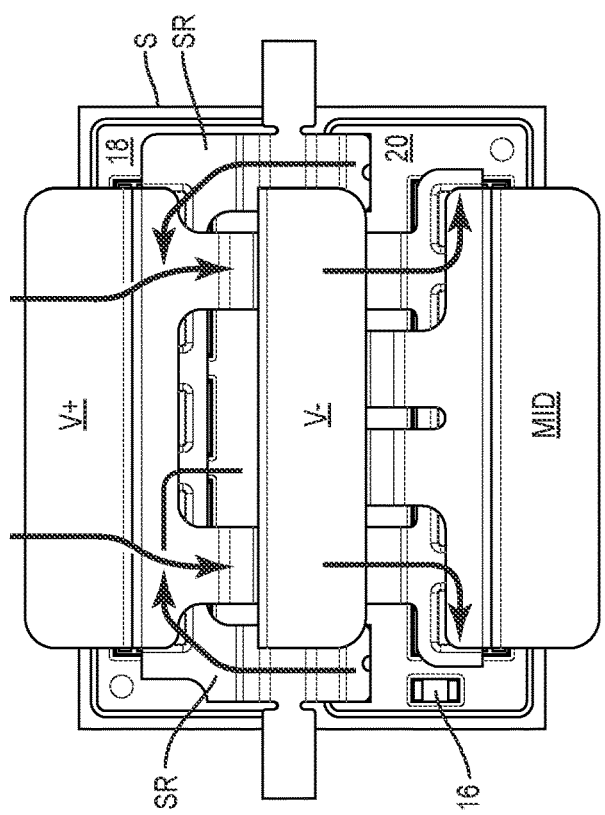
FIG. 24B (POWER LOOP)
FIG. 24A (POWER LOOP)

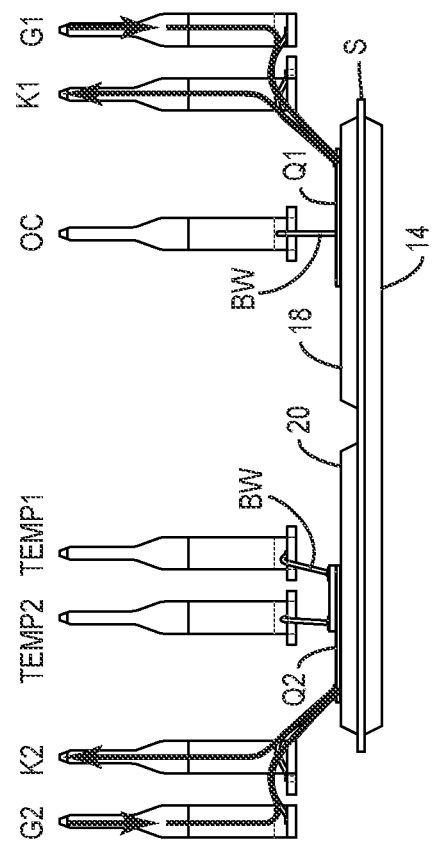
*FIG. 24D* (SIGNAL LOOP)
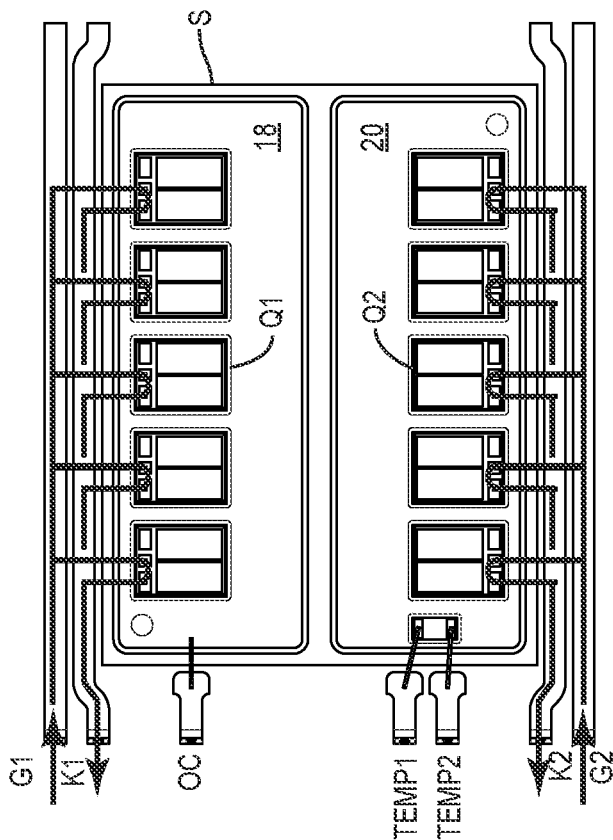
*FIG. 24C* (SIGNAL LOOP)

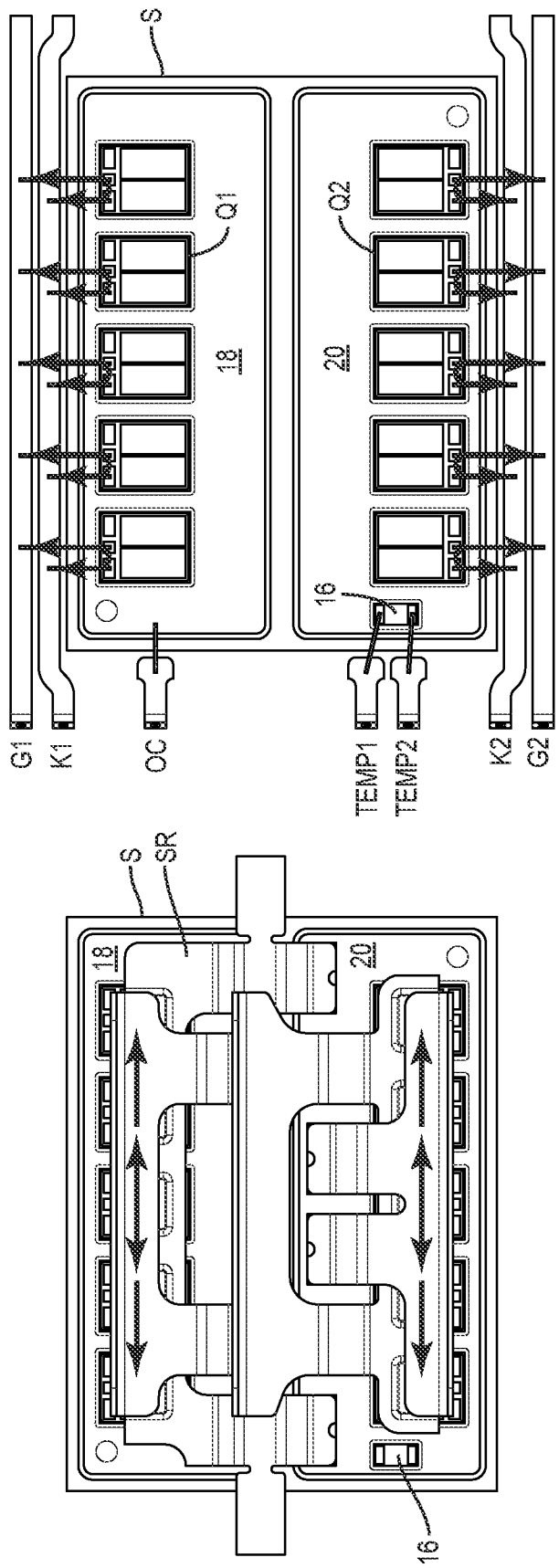

POWER MODULE

FIELD OF THE DISCLOSURE

The present disclosure relates to power modules for high power applications.

BACKGROUND OF THE DISCLOSURE

In high power applications, multiple components for all or a portion of a circuit are often packaged in electronic modules. These modules are generally referred to as power modules that are housed in a thermoplastic, epoxy, or like molded housing that encapsulates the components and the circuit board or substrate on which the components are mounted. The input/output connections for the power module are provided by terminal assemblies that extend out of the housing to facilitate incorporation in and connection to other systems. Such systems may include electric vehicles, power conversion and control, and the like.

SUMMARY

A power module is provided with a substrate having a top side with a first device pad and a second device pad. A first plurality of vertical power devices is electrically and mechanically coupled to the first device pad via first drain contacts, and a second plurality of vertical power devices is electrically and mechanically coupled to the second device pad via second drain contacts to form part of a power circuit. A housing encompasses at least portions of the substrate, the first plurality of vertical power devices, and the second plurality of vertical power devices. A first power terminal extends through a top surface of the housing to the first device pad. A second power terminal extends through the top surface of the housing to the source contacts on a top side of the second plurality of vertical power devices. A third power terminal extends through a top surface of the housing to the second device pad.

In one embodiment, the power module has a source rail coupled between source contacts on a top side of the first plurality of vertical power devices and the second device pad.

In one embodiment, the power module has first and second gate signal terminals. The first gate signal terminal extends into the housing and electrically couples to gate contacts of the first plurality of vertical power devices. The second gate signal terminal extends into the housing and electrically couples to gate contacts of the second plurality of vertical power devices.

In one embodiment, a first source-kelvin signal terminal extends into the housing and electrically couples to source-kelvin contacts of the first plurality of vertical power devices. A second source-kelvin signal terminal extends into the housing and electrically couples to source-kelvin contacts of the second plurality of vertical power devices.

In one embodiment, the first gate signal terminal, the second gate signal terminal, the first source-kelvin signal terminal, and the second source-kelvin signal terminal extend into the housing through a first side of the housing, wherein the first side of the housing extends along and is perpendicular to the top surface of the housing.

In one embodiment, a temperature circuit is on the substrate. A first temperature signal terminal extends through the first side of the housing to the temperature circuit, and a second temperature signal terminal extends through the first side of the housing to the temperature circuit. The temperature circuit may be provided on at least one of the first device pad and the second device pad.

In one embodiment, an over-current signal terminal extends though the first side of the housing and is electrically coupled to the first device pad.

In one embodiment, the first gate signal terminal and the first source-kelvin signal terminal are adjacent one another to form a first group, and the second gate signal terminal and the second source-kelvin signal terminal are adjacent one another and spaced apart from the first gate signal terminal and the first source-kelvin terminal to form a second group. At least one other signal terminal may be provided between the first group and the second group. At least one notch is provided in the first side of the housing between the first group and the second group.

In one embodiment, the first power terminal, the second power terminal, and the third power terminal each have a portion that extends outside of the housing and is parallel with the top surface of the housing.

In one embodiment, a thermal pad resides on a bottom side of the substrate, wherein the thermal pad is exposed through a bottom surface of the housing. A base plate may be provided on the bottom side of the substrate and thermally coupled to the thermal pad. The thermal pad may have a plurality of fins.

In one embodiment, the first plurality of vertical power devices may be coupled in parallel with one another, and the second plurality of vertical power devices may be coupled in parallel with one another.

In one embodiment, the first power terminal has first plurality of legs that extend to the first device pad, the second power terminal comprises a second plurality of legs that extend to the source contacts on the top side of the second plurality of vertical power devices, and the third power terminal comprises a third plurality of legs that extend to the second device pad.

In one embodiment, the power circuit is a half-bridge circuit. Further, the first plurality of vertical power devices and the second plurality of vertical power devices are vertical field effect transistors, which may be silicon carbide field effect transistors.

For creepage, the top surface of the housing may have a plurality of ledges that function as creepage extenders to effectively extend a surface distance between certain conductive elements of the power module.

In one embodiment, a power module has a substrate, vertical power devices, a housing, a source rail, signal terminals, and power terminals. The substrate has a top side with a first device pad and a second device pad. A first plurality of vertical power devices are coupled electrically and mechanically to the first device via first drain contacts, and a second plurality of vertical power devices are coupled electrically and mechanically to the second device pad via second drain contacts to form part of a power circuit. The housing encompasses the substrate, the first plurality of vertical power devices, and the second plurality of vertical power devices. The first power terminal extends through a top surface of the housing to the first device pad. The second power terminal extends through the top surface of the housing to the source contacts on a top side of the second plurality of vertical power devices. The third power terminal extends through a top surface of the housing to the second device pad. A source rail is coupled between source contacts on a top side of the first plurality of vertical power devices and the second device pad. The plurality of signal terminals extends into the housing through one side of the housing and are coupled to certain ones of the first plurality of vertical power devices and the second plurality of vertical power devices via bond wires.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 4 is a top plan view of the power module according to the first embodiment of the disclosure.

FIGS. 5, 6, and 7 are corresponding side views of the power module according to the first embodiment of the disclosure.

FIG. 8 is a bottom plan view of the power module according to the first embodiment of the disclosure.

FIGS. 17A and 17B are top plan and top isometric views of the substrate for the power module according to the first embodiment of the disclosure.

FIGS. 24A and 24B illustrate an exemplary power loop for the first embodiment of the disclosure.

FIGS. 24C and 24D illustrate an exemplary signal loop for the first embodiment of the disclosure.

FIGS. 24E and 24F illustrate exemplary current balancing paths for the first embodiment of the disclosure.

DETAILED DESCRIPTION

Figure 1C:
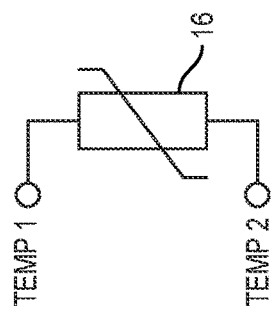
FIG. 1C Illustrates a temperature circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to power modules that are used in high power applications. Power modules may contain one or more power semiconductor devices, such as metal oxide semiconductor field effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and a three-phase switching circuit, which is often referred to as a six-pack.

For the following discussion, a half-bridge circuit is used to facilitate an understanding of the packaging concepts disclosed herein. A basic half H-bridge circuit, as shown in FIG. 1A, is a common power circuit that is used to switch different voltages to a load, such as a motor. The key components of the half H-bridge circuit are a high-side transistor Q1 and a low-side transistor Q2, which are coupled in series between a V+ terminal and a V− terminal. Assume for this example that transistors Q1 and Q2 are power MOSFETs with drain (D), gate (G1, G2), source (S), source-kelvin (K1, K2), and overcurrent (OC) connections. The drain (D) of transistor Q1 is coupled to the V+ terminal, and the source (S) of transistor Q2 is coupled to the V− terminal. The source of transistor Q1 and the drain of transistor Q2 are coupled together and represent the MID terminal, which is essentially the output node that connects to the load (not shown). While field effect devices are illustrated, bi-polar devices benefit from the concepts provided herein. As such, the description and the claims that follow use the terms drain, gate, and source in a generic fashion and the input/output points are defined herein such that the term drain will encompass the drain of a field effect device as well as a collector of a bipolar device. Similarly, the term gate will encompass the gate of a field effect device as well as the base of a bipolar device, and the term source will encompass the source of a field effect device as well as the emitter of a bipolar device, unless otherwise stated.

To increase power handling, multiple power devices may be coupled in parallel with one another. In the illustrated embodiments and as depicted in FIG. 1B, transistor Q1 is represented by three transistors Q1', Q1", and Q1'" that are coupled in parallel with one another, and transistor Q2 is represented by three transistors Q2', Q2", and Q2'" that are coupled in parallel with one another. For conciseness and readability, the parallel transistors Q1', Q1", and Q1'" may be collectively referenced as transistors Q1, and transistors Q2', Q2", and Q2" may be collectively referenced as transistors Q2. In this example, transistors Q1 and Q2 are vertical, N channel MOSFETs, wherein the drain contact is on the bottom of the device and the source, gate, and source-kelvin contacts are on the top of the device. The half H-bridge circuit of FIG. 1B is implemented in the power module embodiments described below but is just one of the many types of circuits that will benefit from the concepts provided herein.

Figure 1B:
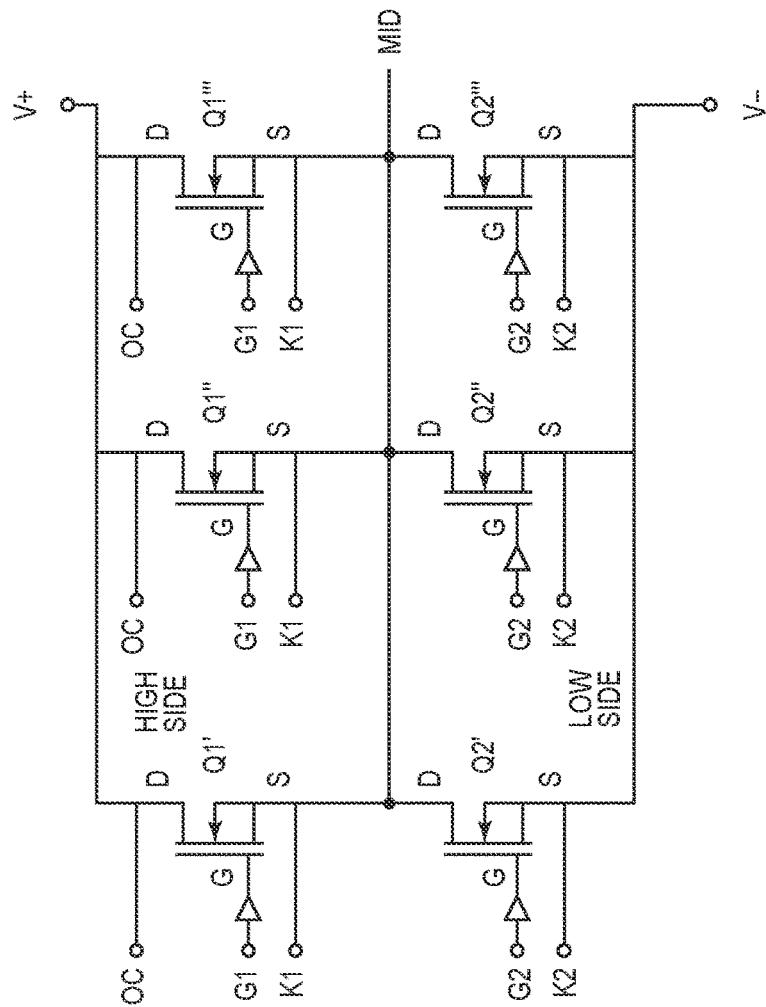
FIG. 1B illustrates a practical implementation of the half H-bridge circuit of FIG. 1A.
Figure 1A:
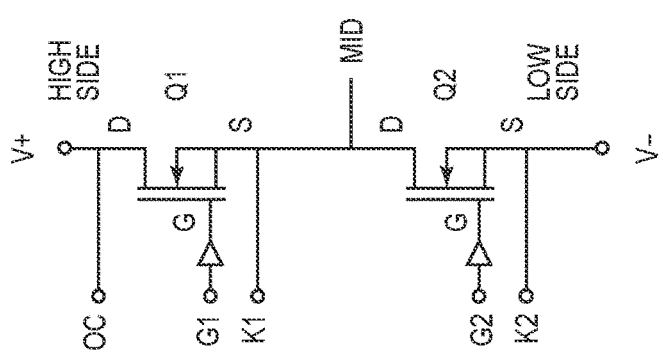
FIG. 1A illustrates a schematic of a typical half H-bridge circuit.

As illustrated in FIG. 1C, additional circuitry, such as a temperature circuit 16 for sensing internal device temperatures, may be provided in association with the three-phase circuit and can be as simple as a thermistor, negative temperature coefficient (NTC) device, or resistance temperature detector (RTD) with signal terminals TEMP1 and TEMP2. In such embodiments, the resistance of the thermistor or RTD will change with temperature and be measurable across signal terminals TEMP1 and TEMP2. The thermistor will generally have a negative temperature coefficient in that the resistance has a negative correlation to temperature, while the RTD will generally have a positive temperature coefficient in that the resistance has a positive correlation to temperature. Additional circuits, such as current sensing, may be introduced using functional elements and dedicated pins.

Figure 2:
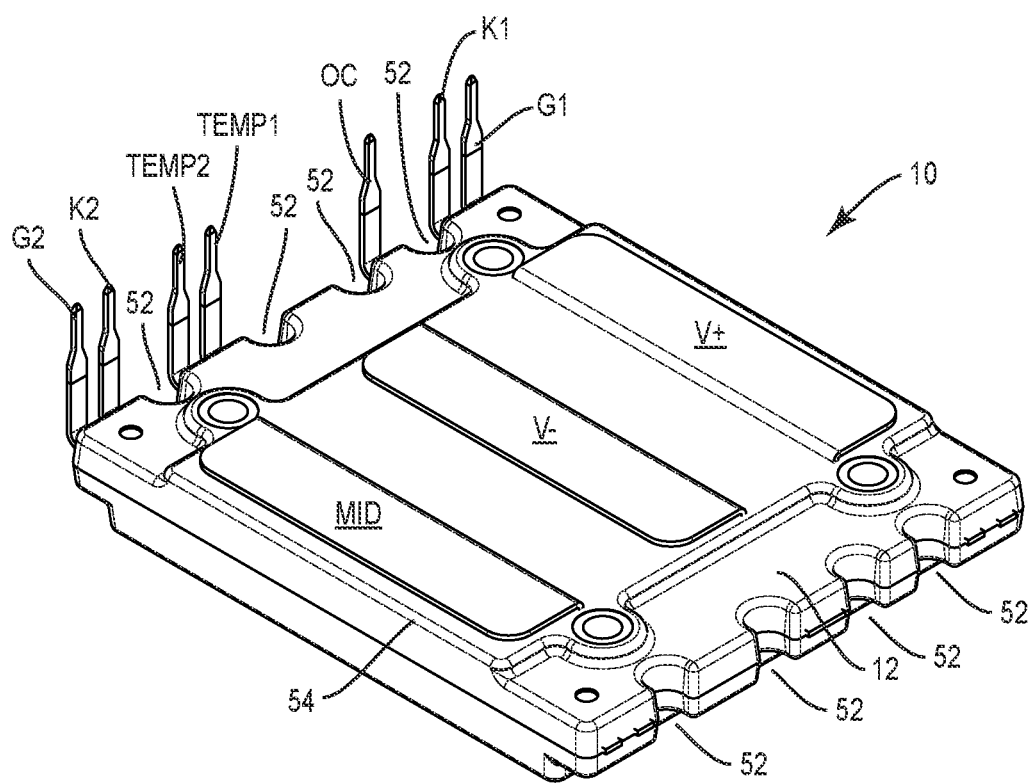
FIG. 2 is an isometric view of a top side of a power module according to a first embodiment of the disclosure.
Figure 3:
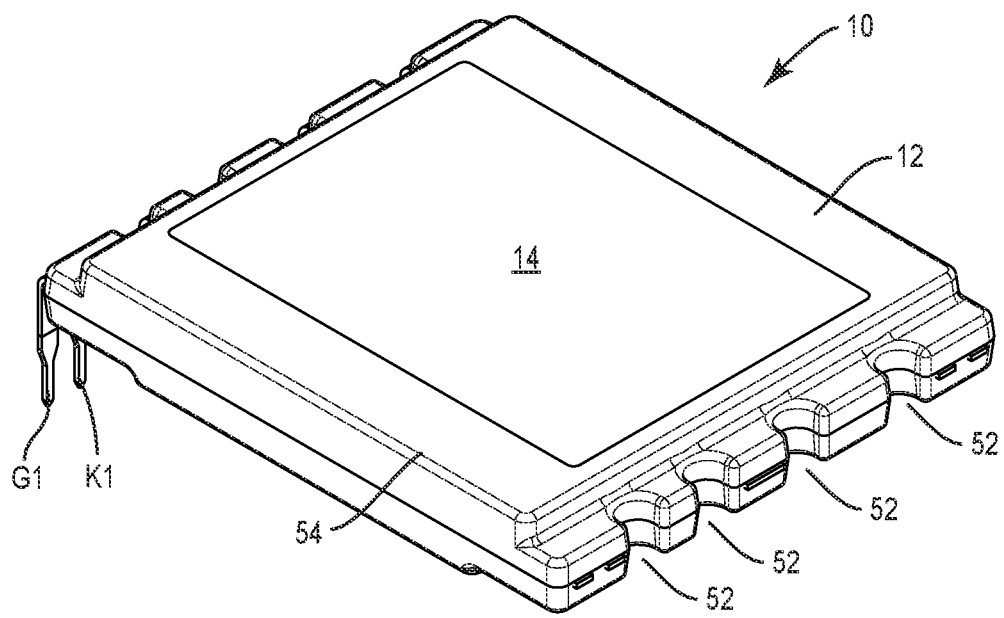
FIG. 3 is an isometric view of a bottom side of the power module according to the first embodiment of the disclosure.

FIGS. 2-8 are various isometric and plan views of a power module 10 that provides the electronics necessary to implement various power circuits, such as the three-phase circuit and temperature circuit 16 of FIGS. 1B and 1C, according to the first embodiment. FIGS. 2 and 3 are top and bottom isometric views. FIG. 4 is a top plan view. FIGS. 5, 6, and 7 are opposing side and end views, respectively. FIG. 8 is a bottom plan view. The power module 10 has a housing 12 that may include a thermal pad 14, which is visible in FIGS. 3 and 5-8.

The housing 12 encompasses most or all of the internal components of the power module 10 and provides mechanical structure, electrical isolation, and environmental protection. Depending on the embodiment of the design, the housing 12 may be formed with a transfer or compression molded epoxy compound with fillers for CTE (coefficient of thermal expansion) matching, adhesion, electrical parameters, mechanical parameters, etc. The housing 12 may also be an injection molded outer shell which is glued or similarly attached to the substrate S, which is described further below. The housing 12 may be co-molded over the metalwork for a higher level of integration. If present, an inner cavity in the housing 12 would subsequently be filled with an insulating soft gel, hard coat of epoxy or silicone, or similar pourable or injectable filler. The housing 12 may also be a combination of injection molded components and then molded over with an epoxy mold compound, forming a hybrid composite of the two.

The thermal pad 14 on the backside of the power module 10 is electrically isolated from any internal circuitry and facilitates the transfer of heat from the power module 10 to ambient, a heat sink structure, or the like. The thermal pad 14 is exposed without coverage of the housing material. For example, an epoxy resin may seep in and leave a small amount of flashing. To ensure the mold compound or other encapsulant does not cover this critical surface, hold down pins may be implemented which push on the edges or other surfaces of the substrate S to enhance the seal to the mold tooling. These pins retract as the material cures and may leave a vestige in the compound. Ejector pins are used to release the product from the mold tooling and will also leave small vestiges. The number and location of the hold down and ejector pins will vary based on the design embodiment, as more or less of these elements may be required as the width of the module varies.

Clearance and creepage are important aspects for a high voltage product. Between conductors at different voltage potentials, clearance is the shortest direct path in air between them. Creepage is the shortest direct path along a surface between them. Meeting safety standards is a challenge and is often at odds with manufacturing method (tooling, epoxy flow, etc.) and product size (footprint and power density). For small transfer molded packages, particularly low profile and high voltage silicon carbide, SiC, based products, reaching a suitable balance between module size and voltage safety.

In certain embodiments, voltage safety is achieved in several manners. Signal terminals G1, G2, K1, K2, TEMP1, TEMP2, OC, are grouped together if at similar voltage potentials. Terminals of different potentials, such as high side and low side gate and source kelvin contacts, or between those contacts and the accessory terminals may be spaced to meet clearance standards, as illustrated in FIGS. 2 and 3. For creepage, notches, ledges, or ridges may be added between them to increase the surface distance. In the illustrated embodiments, creepage extending notches 52, which are located between groups of signal terminals G1, G2, K1, K2, TEMP1, TEMP2, OC of like potential, and creepage extending ledges 54, which are formed along the top and bottom surfaces of the housing 12, are provided as seen in FIGS. 2 and 3. Specific features will depend on the size and voltage class of a given embodiment of the design.

Figure 9:
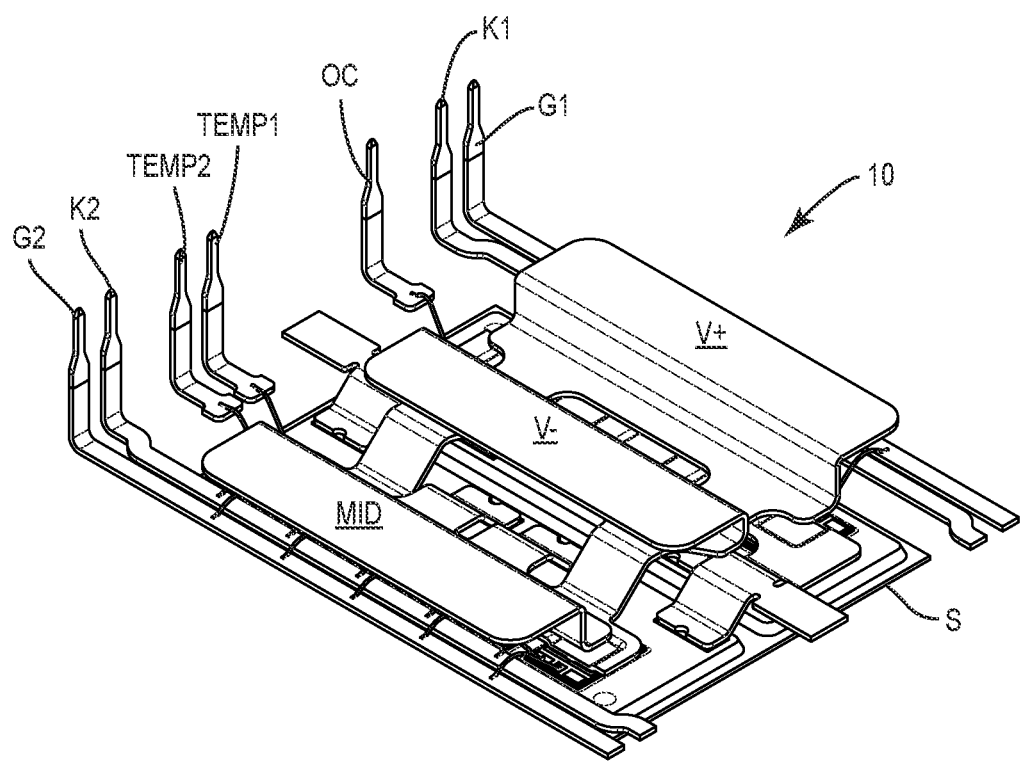
FIG. 9 is an isometric view of a top side of the power module according to the first embodiment of the disclosure.
Figure 10:
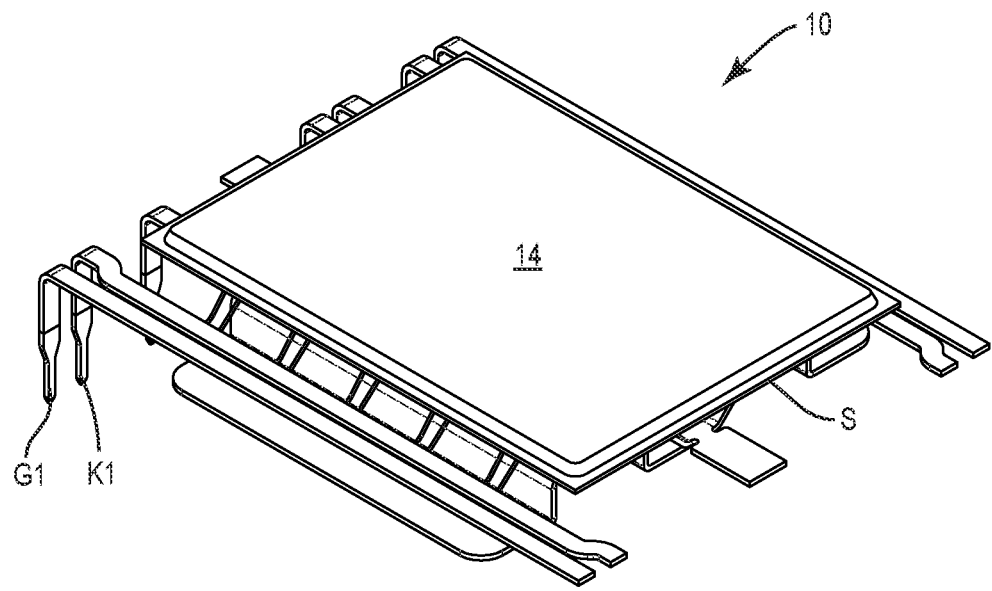
FIG. 10 is an isometric view of a bottom side of the power module according to the first embodiment of the disclosure.
Figure 15:
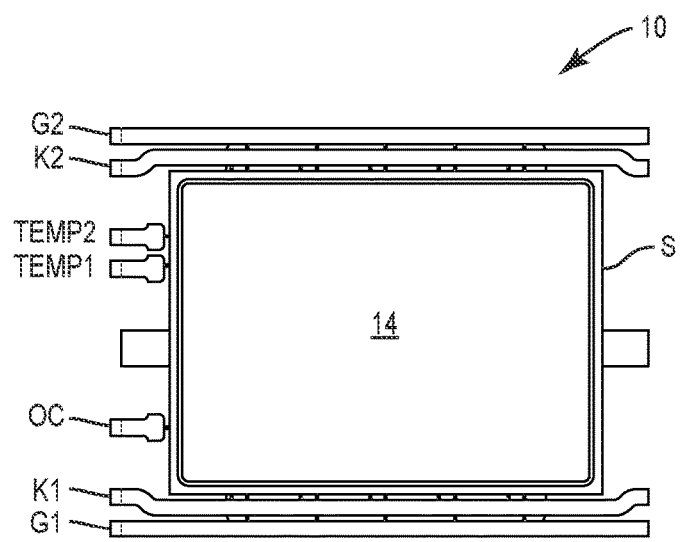
FIG. 15 is a bottom plan view of the power module according to the first embodiment of the disclosure.
Figures 11, 12, 14:
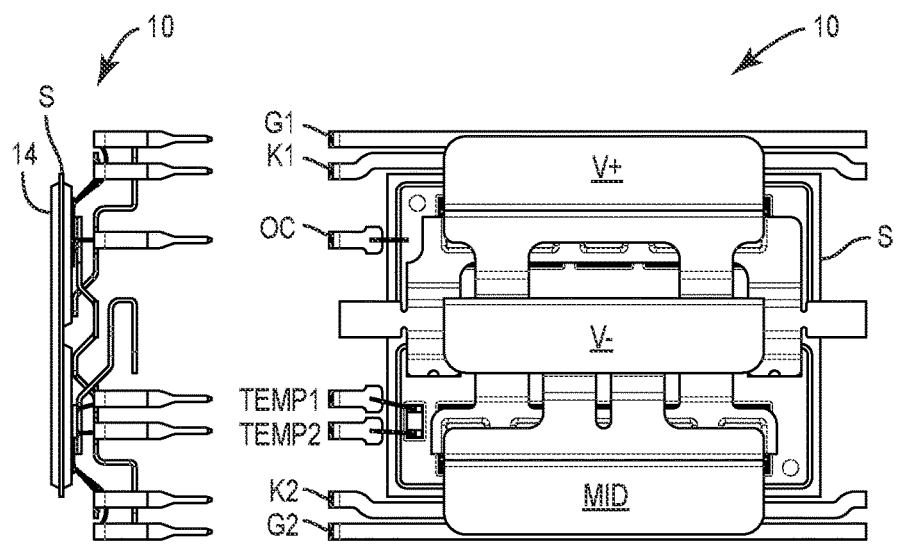
FIG. 11 is a top plan view of the power module according to the first embodiment of the disclosure.
FIGS. 12, 13, and 14 are corresponding side views of the power module according to the first embodiment of the disclosure.
Figure 13:
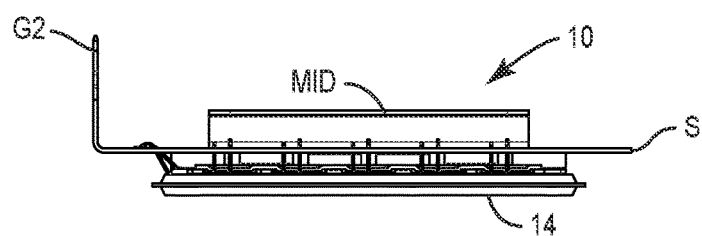

FIGS. 9-15 illustrate various isometric and plan views of the internal architecture of the power module 10, wherein the housing 12 and bond wires BW (or like interconnects) are removed to more clearly illustrate the various components of the internal architecture of the power module 10. FIGS. 9 and 10 are top and bottom isometric views. FIG. 11 is a top plan view. FIGS. 12, 13, and 14 are opposing side and end views, respectively. FIG. 15 is a bottom plan view. The following description is directed initially to FIGS. 9-15 where the bond wires BW are not shown.

Figure 16:
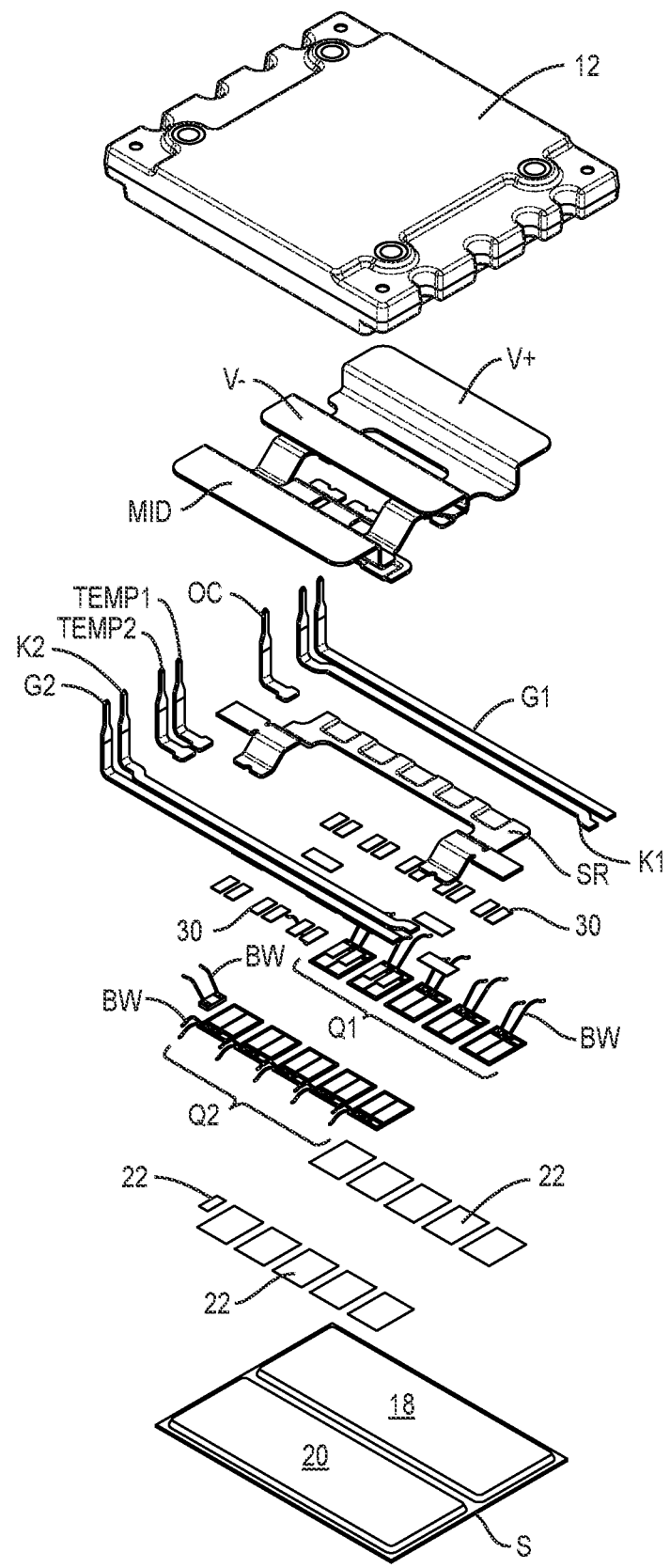
FIG. 16 is an exploded view of the power module according to the first embodiment of the present disclosure.

FIG. 16 is an exploded view of the power module 10. As illustrated in the exploded view of FIG. 16 and the plan and isometric views for the substrate S of FIGS. 17A and 17B, the heart of the internal architecture of the power module 10 is a substrate S upon which at least two conductive device pads 18, 20 are formed on the top side. The thermal pad 14 is formed on the bottom side of the substrate S, as best illustrated in FIGS. 10 and 15. The device pads 18, 20 and the thermal pad 14 may be formed from any conductive material, such as copper or the like. For the half-bridge circuit of FIG. 1B, the high-side transistors Q1', Q1'', Q1''' are generally referenced as high-side transistors Q1 and mounted on the first device pad 18, which extends along a first of the power module 10. Similarly, the low-side transistor Q1', Q2'', Q''' are generally referenced as low-side transistors Q2 and mounted on the elongated device pad 20. The drains D on the bottom of the high-side transistors Q1 are directly attached to the first device pads 18 to form both a mechanical and electrical connection of the high-side transistors Q1 to the device pads 18. The drains D on the bottom of the high-side transistors Q2 are directly attached to the first device pads 20 to form both a mechanical and electrical connection of the transistors Q2 to the device pads 20. Notably, the temperature circuit 16 may be mounted on the second device pad 20 wherein the temperature circuit 16 is electrically isolated from second device pad 20 while remaining thermally coupled to the second device pad 20. The temperature circuit 16 could be mounted on the first device pad 18 or in a different location of the substrate S based on designer preference.

Reference is now made to the exploded view of the power module 10 in FIG. 16. Starting from the bottom of the figure, the drain pads on the bottoms of transistors Q1 and Q2 are respectively electrically and mechanically attached to the first and second device pads 18, 20 on the substrate S using device attach material 22. Portions of a source rail SR and the power terminal V− are respectively coupled to the sources of the high side transistors Q1 and the low-side transistors Q2 using device attach material 30. The device attach material 22 and 30 may be the same or a different material, such as a solder, adhesive, or sintered metal. These materials may be avoided if the connections are made using a laser weld, an ultrasonic weld, or the like so long as the connection provides mechanical structure, high current interconnection, and high thermal conductivity. The power terminals V−, V+, MID, source rail SR, and signal terminals G1, G2, K1, K2, OC, and temperature circuit signal terminals TEMP1, TEMP2 may be formed from a single lead frame.

Bond wires BW are used to make certain component and terminal connections. The bond wires BW are generically labeled, but care is taken to clearly describe the connections provided by all of the illustrated bond wires BW. The lead frame is typically a metal contact strip for high current external connection and internal interconnection. Any contacts are joined together on a single sheet, often with multiple products per sheet, and processed as an array before being formed and singulated. The bond wires BW may be ultrasonically or thermosonically bonded large diameter wire, capable of supporting relatively high current electrical interconnection.

A detailed description of the internal connections is now provided, starting with reference to FIGS. 17A and 17B. As illustrated, the high side transistors Q1 are mounted on the first device pad 18 and the low-side transistors Q2 are mounted on the second device pad 20 via the respective drain pads. The temperature circuit 16 is also mounted on the second device pad 20. The source contacts 24, gate contacts 26, and source-kelvin contacts 28 are shown on the tops of each of the high-side transistors Q1 and the low-side transistors Q2.

Figure 18B:
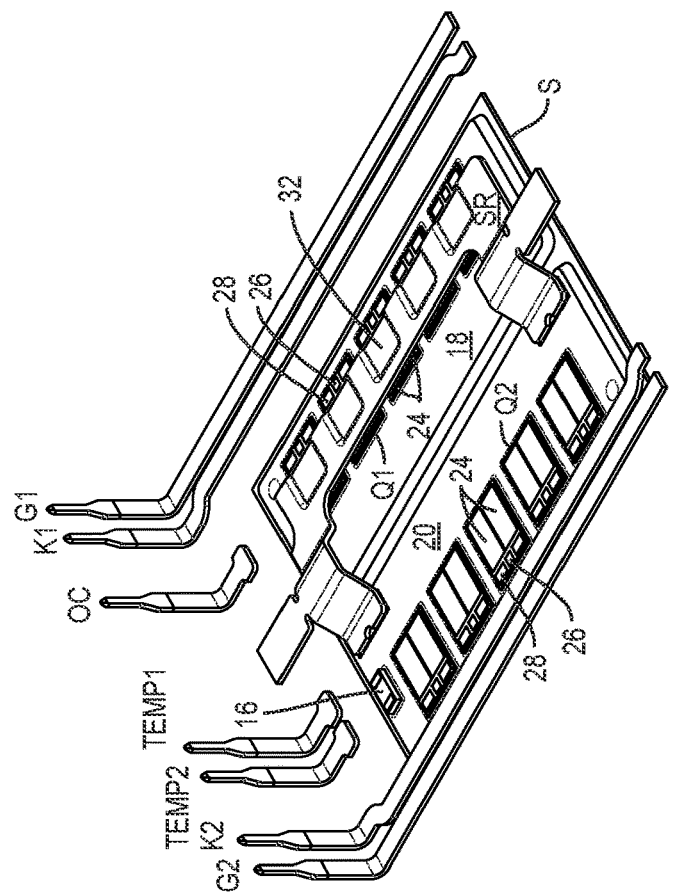
FIGS. 18A and 18B are top plan and top isometric views of the substrate as well as the source rail and control terminals for the power module according to the first embodiment of the disclosure.
Figure 18A:
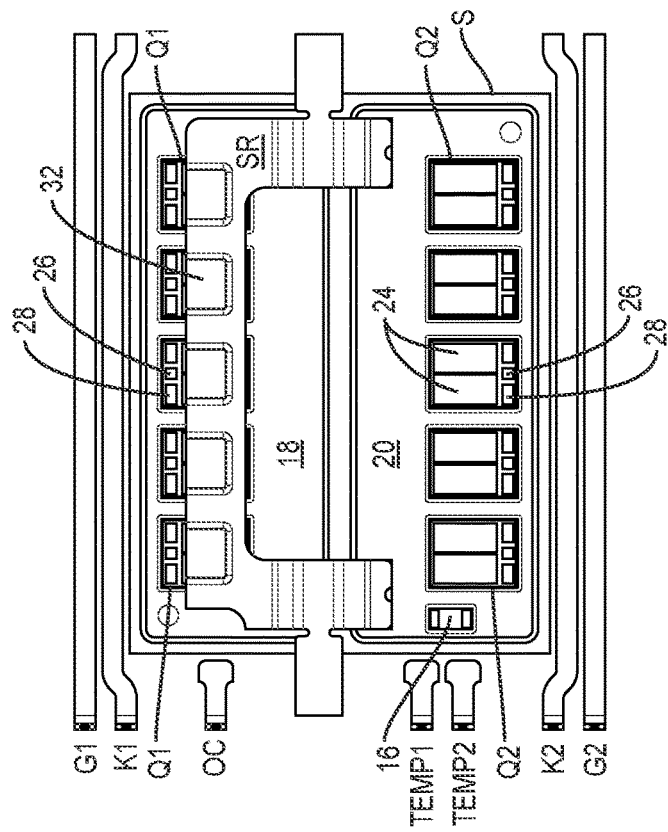

In FIGS. 18A and 18B, the source rail SR connects the source contacts 24 of the high-side transistors Q1 to the second device pad 20 to provide the electrical connection between the sources of the high-side transistors Q1 to the drains of the low-side transistors Q2. The middle of the source rail SR extends over the high-side transistors Q1. Embossments 32 formed in the source rail SR extend portions of the source rail SR toward and into contact (directly or via the device attach material 30) with the source contacts 24 of the high-side transistors Q1. The opposing ends of the source rail SR extend to and provide both a mechanical and electrical coupling with the second device pad 20.

The elongated terminals for signal terminals G1, G2, K1, and K2 are also illustrated in FIGS. 18A and 18B. In the illustrated embodiment, signal terminals K1 and K2 have elongated portions of which that run along and adjacent opposite sides of the substrate S. Signal terminals G1 and G2 have elongated portions of which that run along signal terminals K1 and K2 and parallel to one another. An extended portion of signal terminal K1 runs between an extended portion of signal terminal G1 and the side of the substrate S where the high-side transistors Q1 are aligned. An extended portion of signal terminal K2 runs between an extended portion of signal terminal G2 and the side of the substrate S where the low-side transistors Q2 are aligned. Signal terminals TEMP1, TEMP2, an OC are located along a third side of the substrate, as illustrated.

Figure 19B:
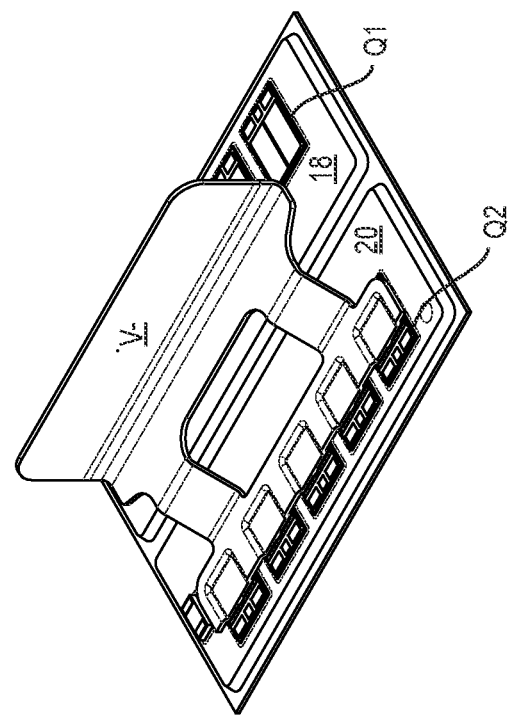
FIGS. 19A and 19B are top plan and top isometric views of the substrate as well as the V− power terminal for the power module according to the first embodiment of the disclosure.
Figure 19A:
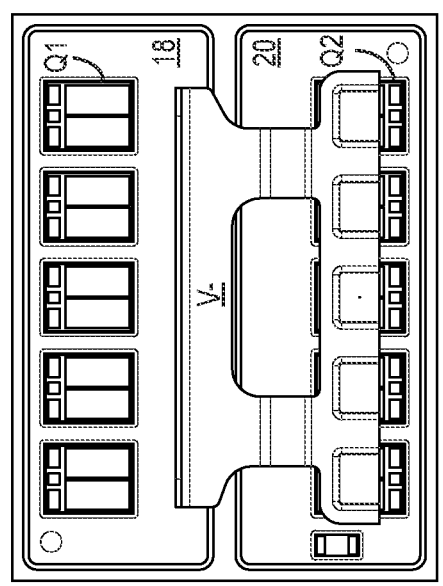

In FIGS. 19A and 19B, power terminal V− connects to the source contacts 24 of the low-side transistors Q2. A first portion of power terminal V− extends over the low-side transistors Q2. Embossments 32 formed in the first portion of the power terminal V− extend toward and into contact (directly or via the device attach material 30) with the source contacts 24 of the low-side transistors Q2. Note that the external contact portion of power terminal V− is not yet folded over and remains orthogonal to the top surface of the substrate S instead of being parallel with the substrate S, as provided in the finished power module 10.

Figure 20B:
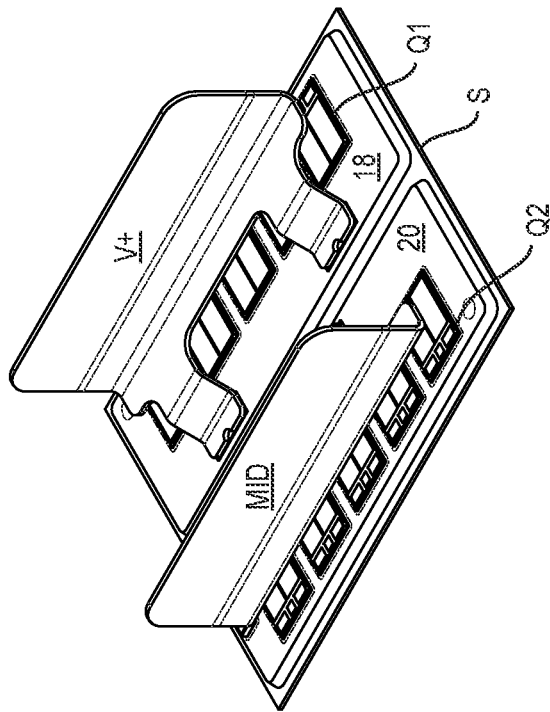
FIGS. 20A and 20B are top plan and top isometric views of the substrate as well as the MID and V+ power terminals for the power module according to the first embodiment of the disclosure.
Figure 20A:
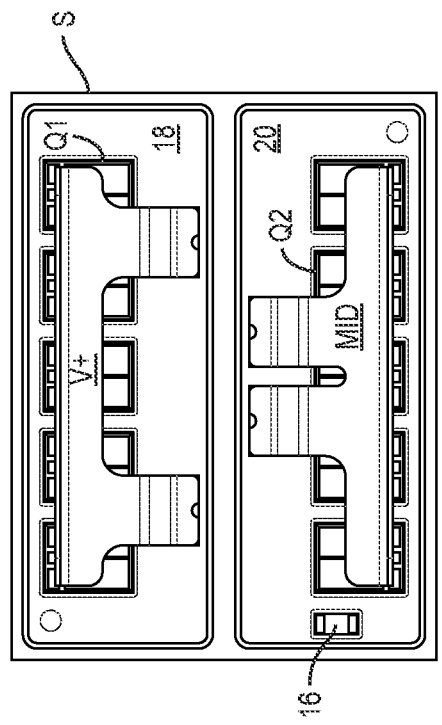

In FIGS. 20A and 20B, power terminal V+ resides at least partially over the high-side transistors Q1 and the first device pad 18. Power terminal V+ has at least two legs that extend toward and connect to the first device pad 18 to facilitate a connection to the drains of the high-side transistors Q1. Similarly, power terminal MID resides at least partially over the low-side transistors Q2 and the second device pad 20. Power terminal MID also has at least two legs that extend toward and connect to the second device pad 20 to facilitate a connection to the drains of the low-side transistors Q2 as well as the sources of the high side transistors Q1 via the source rail SR (FIGS. 18A and 18B).

Note that the external contact portions of power terminal V+ and power terminal MID are not yet folded over and remain orthogonal to the top surface of the substrate S instead of being parallel with the substrate S, as illustrated in FIG. 2.

Figure 21:
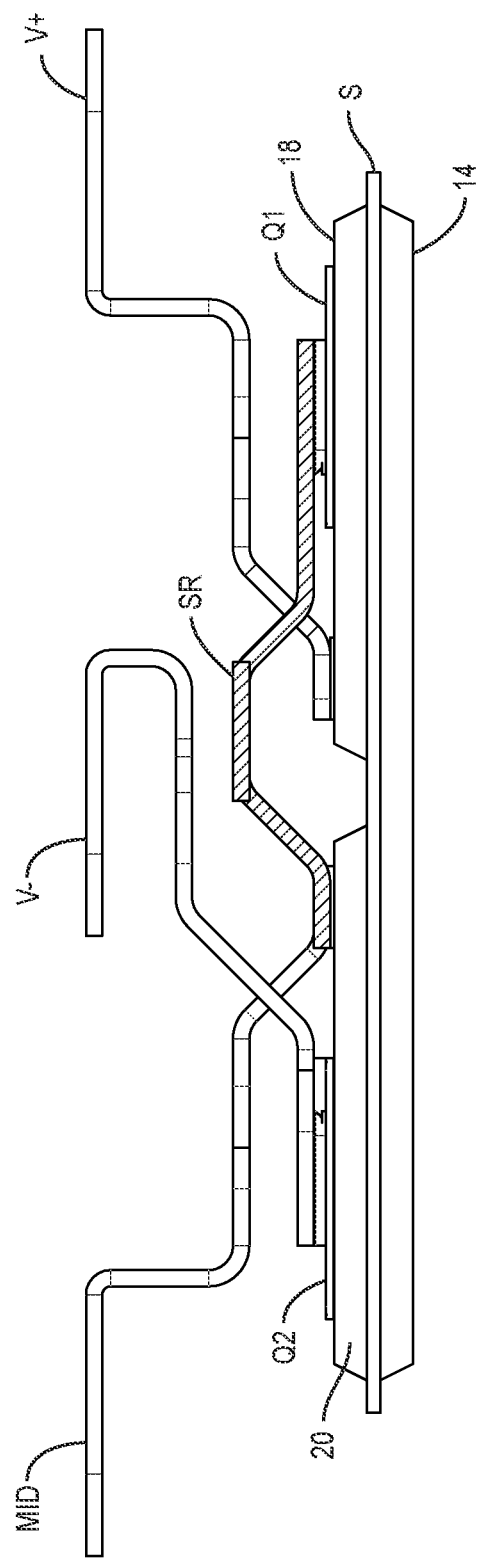
FIG. 21 is a side view of the substrate with the source rail and MID, V−, and V+ power terminals for the power module according to the first embodiment of the disclosure.

FIG. 21 provides a side view of the substrate S, wherein the arrangement of the power terminals V+, V− MID as well as the source rail SR is clearly visible. Note that the contact portions of the power terminals V+, V−, MID are folded over in their final configuration to facilitate contact with other components. The contact portions are parallel with the surfaces of the substrate S and the housing 12 (not shown).

Figure 22B:
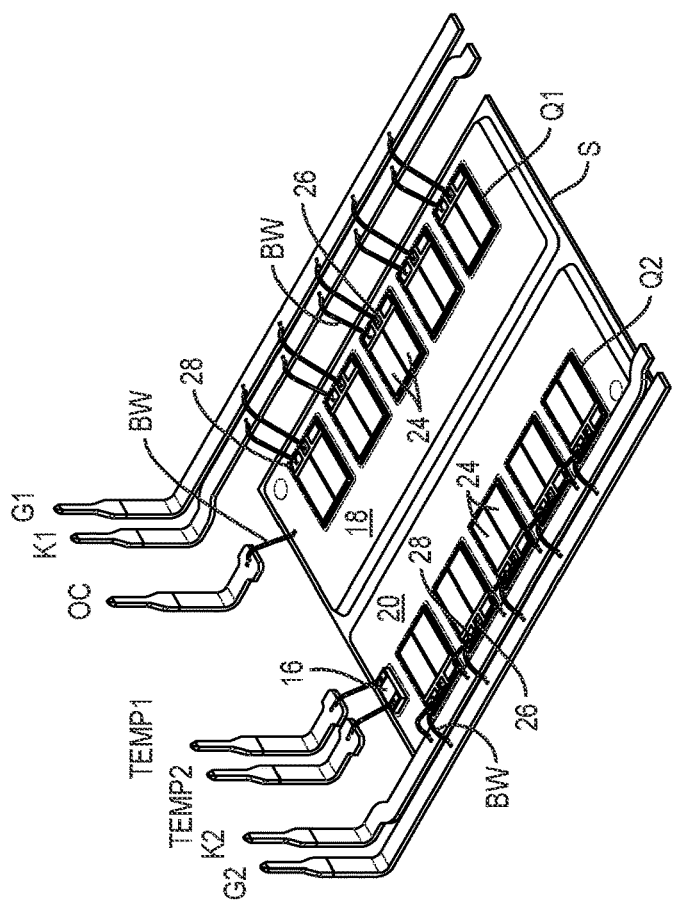
FIGS. 22A and 22B are top plan and top isometric views of the substrate as well as control terminals and associated bond wires for the power module according to the first embodiment of the disclosure.
Figure 22A:
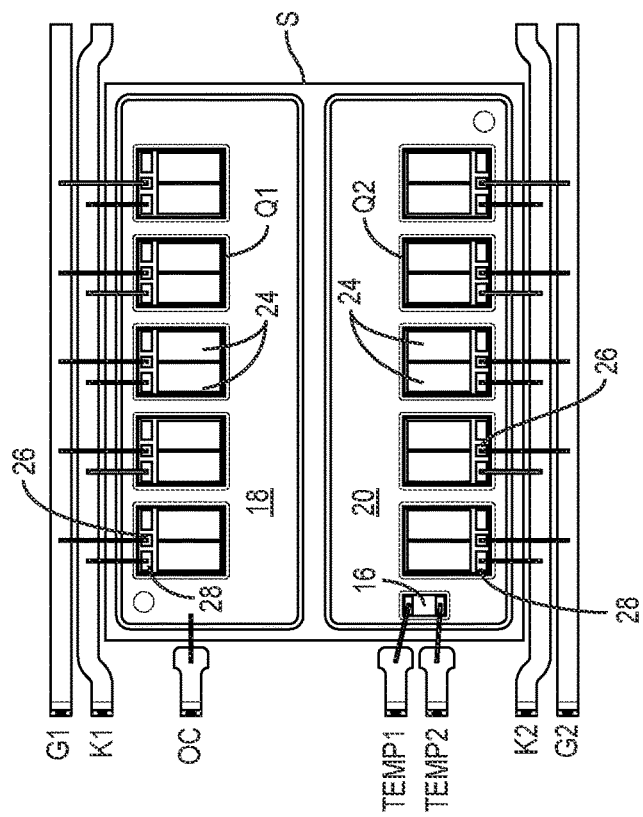

FIGS. 22A and 22B illustrate exemplary wire bonds for the power module 10. As depicted, bond wires BW are used in association with the signal terminals G1, G2, K1, K2, OC, TEMP1, and TEMP2. Bond wires BW are used to connect each gate contact 26 of each high-side transistor Q1 to the rail of signal terminal G1; each source-kelvin contact 28 of each high-side transistor Q1 to the rail of signal terminal K1; each gate contact 26 of each low-side transistor Q2 to the rail of signal terminal G2; each source-kelvin contact 28 of each low-side transistor Q2 to the rail of signal terminal K2; the signal terminal OC to the first device pad 18; and signal terminals TEMP1 and TEMP2 to different contact on the temperature circuit 16. While a single bond wire BW is shown for each connection, multiple bond wires BW may be employed.

Figure 23B:
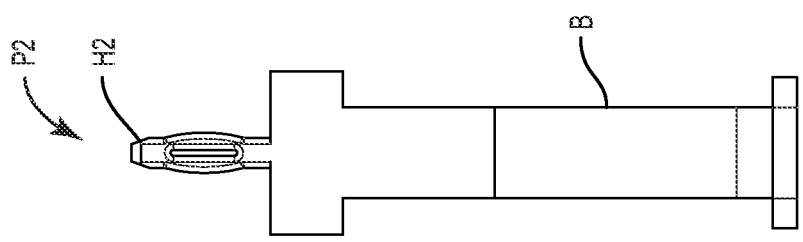
FIGS. 23A and 23B illustrate terminal pins according to two embodiments of the disclosure.
Figure 23A:
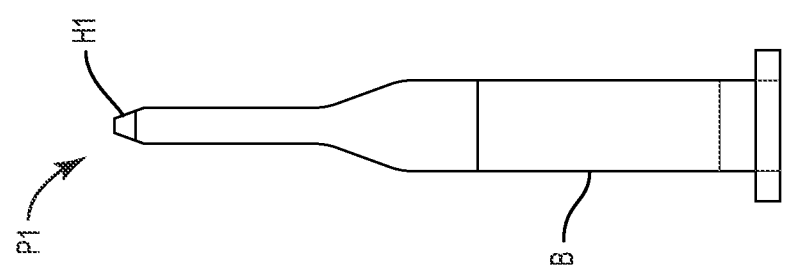

FIGS. 23A and 23B show two exemplary pin configurations for any of the signal terminals G1, G2, K1, K2, OC, TEMP1, and TEMP2 described above. The pin P1 of FIG. 23A has a linear body B that narrows into a linear head H1, which is configured to be inserted into a corresponding aperture of a printed circuit board or the like, and soldered to facilitate a mechanical and electrical connection between the printed circuit board and the head H1. Pin P2 of FIG. 23B has a press-fit head H2 at the end of the linear body B. The press-fit head H2 is designed to compress radially when inserted into the corresponding aperture of the printed circuit board to provide a solderless mechanical and electrical connection between the printed circuit board and the head H1. Once inserted, the press-fit head will apply outward, radial pressure to secure the press-fit head H2 in the corresponding aperture. Multiple press-fit head styles could be used, depending on the thickness of the metal and insertion process. The pins P1 will generally have a bend of approximately 90 degrees (i.e. 80-100 degrees) as shown in FIGS. 22A and 22B. The bend is not illustrated in FIGS. 23A and 23B to better illustrate the linear body and configuration of the heads H1, H2.

The design of the power module 10 provides a high level of symmetry through the direct attachment of portions of the power terminal V− and the source rail SR of the lead frame to the topside source contacts 24 of low-side transistors Q2 and the high-side transistors Q1, respectfully. This effectively adds multiple layers of conduction through which to route the electrical current. Using typical power substrates and conventional wire bonding techniques will only allow for a single layer of metal, which often results in larger and more compromised layouts. Power wire bonds, which may be avoided completely in certain embodiments, are also commonly a source of reliability issues from cyclic electrical, thermal, and mechanical stresses.

In general, there are two categories of electrical loops in a power package: power loops and signal loops. Power loops are the high voltage, high current paths through the high-side transistors Q1 and the low-side transistors Q2 that deliver power to the load via the drains (or collectors) and sources (or emitter) of the respective semiconductor device. Signal loops are the low voltage, low current paths through the gate (or base) and the source (or emitter) of the high-side transistors Q1 and the low-side transistors Q2. The gate-source (or base-emitter) signal path actuates the high-side transistors Q1 and the low-side transistors Q2 to turn-on or turn-off.

The V+ to V− loop is typically connected to a DC input, often a battery or power supply with a DC-link capacitor. Stored energy in the magnetic field, due to inductance, can result in high voltage overshoot during switching events. Minimizing inductance will lessen those spikes. Depending on the system, a lower inductance can manifest in reliability improvements due to lower voltage stress, and/or allow for more aggressive, faster switching.

FIGS. 24A and 24B illustrate a top down and side view of the power commutation loop. The multilayer structure allows the power to enter and leave the power module 10 efficiently and with a good amount of magnetic flux cancellation. Power flows in through (1) the wide, power terminal V+, (2) down to the first device pad 18 on the substrate S, (3) over to the drain D of the high-side transistors Q1, which are connected with parallel with one another, (4) up through the high-side transistors Q1 to the source rail SR via the source contacts 26, (5) through the source rail SR to the second device pad 20 on the power substrate S, (6) over to drains D of the low-side transistors Q2, (7) up through the low-side transistors Q2 to the power terminal V−, and (8) through the wide, power terminal V−. The loops are well balanced for each paralleled device. The low profile of the power module 10, compact module size, flux cancellation, and balanced loops result in extremely low loop inductance and clean, efficient switching.

The signal loops for also benefit from a low impedance to minimize voltage stresses on the gates of the high-side transistors Q1 and the low-side transistors Q2 during switching. While these can be buffered or reduced by adding resistors, this is often at the cost of higher package complexity, higher cost, and slower switching speeds. Most importantly, for optimal switching performance, the power loops and signal loops should be substantially, if not completely, independent of each other to enable low switching loss with fast, well controlled dynamics.

The drain-source (or collector-emitter) and gate-source (or gate-emitter) loops share the same connection at the source (or emitter) of each device. If the power path couples into the signal paths, extra dynamics are introduced through either positive or negative feedback. Typically, negative feedback introduces extra losses as the power path coupling fights the control signal. For instance, the power path coupling tries to turn the device off when the control signal is trying to turn the device on. Positive feedback typically causes instability as the power path coupling amplifies the control signal until the devices are destroyed. Ultimately, the coupling of power and signal paths result in a reduction in switching quality, slower switching speeds, increased losses, and possible destruction.

Accordingly, a beneficial method to improve switching quality is to ensure independent loops. The power source connection has a separate path from the signal source (referred to as a source Kelvin) such that one does not overlap or interfere with the other. The closer the separate connections are made to the device, the better the switching performance.

FIGS. 24C and 24D are top down and side views of the internal signal loops for the high-side transistors Q1 and low-side transistors Q2. Here, the signals flow (1) into the signal terminal G1/G2, (2) through the gate signal terminal G1/G2, (3) through a bond wire BW directly to the gate contacts 26 of the high-side transistors Q1 or low-side transistors Q2, (4) through high-side transistors Q1 or low-side transistors Q2 to the source contacts 24, (5) through a bond wire BW from the source contacts 24 or source kelvin contacts 28 of the high-side transistors Q1 or low-side transistors Q2 to the rails of the source-kelvin signal terminals K1/K2, and (6) out through the source kelvin signal terminal K1/K2. As shown, a true source kelvin implementation is provided in which the power and signal loops are independent.

A further issue arises in transconductance mismatches between paralleled devices. Transconductance is effectively the current gain of the device wherein current gain bears on the relationship between the output current to the input voltage. During switching, the input voltage rises and results in an associated rise in the output current. If there is a transconductance difference between paralleled devices, which is common in Silicon Carbide power devices, each device will have slightly different turn on characteristics. With different currents running through each device, each device will have slightly different voltages across themselves. This voltage mismatch will result in what is referred to as a 'balancing current' that flows between the devices during switching.

The balancing current will prefer the path of least impedance, which could be through the signal loop instead of the power loop. If balancing current flows through the signal loop, it can affect switching quality. Introducing this high, uncontrolled current through the signal loop can also present a reliability concern as the signal loops are not intended to carry high currents.

The possible paths through the power and signal connections are illustrated in FIGS. 24E and 24F. Here, a significantly lower inductance is found through the highly conductive and high cross-sectional area power terminals V+, V−, MID attached to the topside of the devices. In comparison, the effective path length and cross-sectional area of the signals have a comparatively higher impedance. In practice, nearly all of the balancing current will flow through the power terminals V+, V−, MID and not interfere with the signals.

In practice, the power terminals V+, V−, MID are permanently attached to external bus bars, cables, high current printed circuit board, etc. through welding or soldering. This generally provides the best electrical and mechanical connection with the lowest resistance and highest reliability.

The signal terminals G1, G2, K1, K2, TEMP1, TEMP2, OC may be permanently attached to the driver PCB, header, cable harness, etc. through welding, soldering, or conductive epoxy. A tapered pin tip allows for the solder to form a fillet to enhance mechanical robustness. They could also be formed into press fit pins for reusable insertion into a compatible plated hole in a printed surface board. These pins have a compliant head and a shoulder to press against. Illustrations of signal pin variations are described above in association with FIGS. 23A and 23B. Signal contacts could be formed on either the left side, right side, or both.

The thermal pad 14 may be permanently affixed to an external cold plate through a high thermal conductivity attach, such as sintered metal, solder, thermally conductive epoxies, etc. This minimizes the layers and distance from the heat generated from losses in the power semiconductors to the heat removal in the cold plate, heat sink, etc.

Figures 25A, 25B:
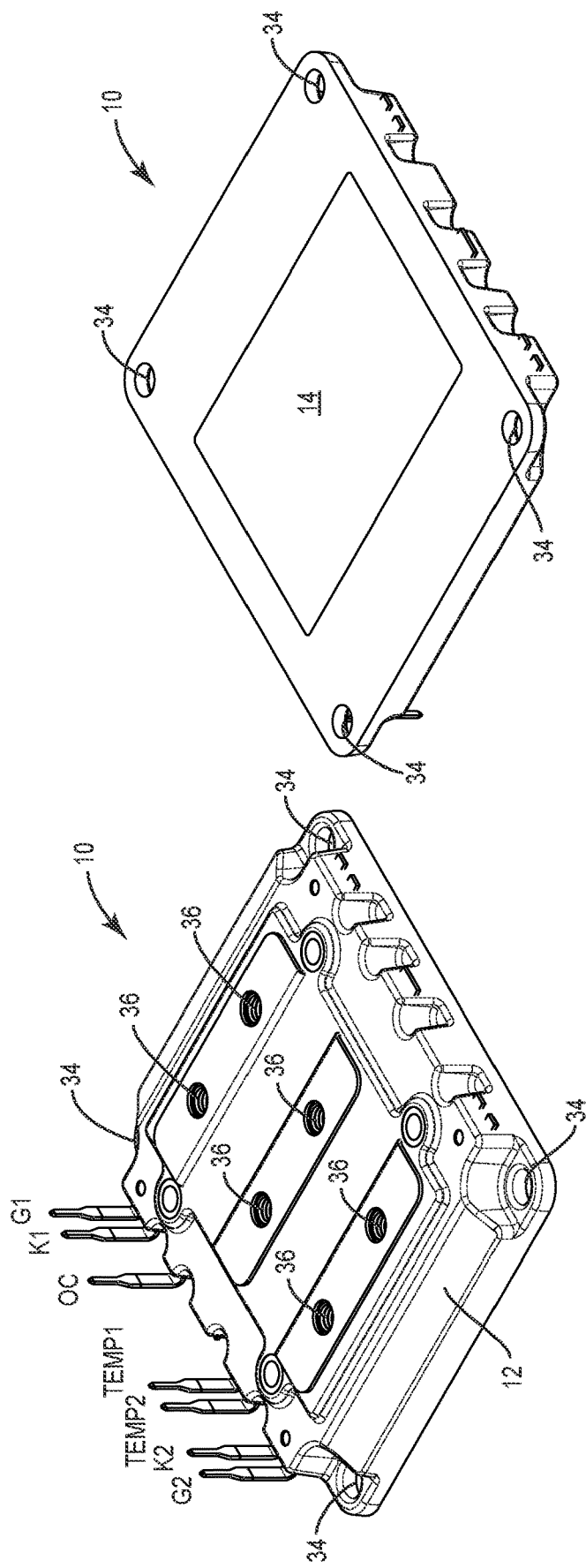
FIG. 25A is an isometric view of a top side of a power module according to a second embodiment of the disclosure.
FIG. 25B is an isometric view of a bottom side of the power module according to the second embodiment of the disclosure.

In some applications, there is a desire to be field serviceable, wherein products need to be replaced or removed. A variation of the product to facilitate bolting is conceivable in which the housing 12 is extended to accommodate bolting sites at the corners or other locations along the perimeter of the housing 12. FIGS. 25A and 25B are top and bottom isometric views of a version of the power module 10 with four bolt holes 34 at the four corners of the housing 12. The bolt holes 34 allow for attachment and removal from a cooling system. Each bolt hole 34 may be reinforced with a metal bushing to allow for stronger clamping. A thermal grease, thermal pad, or the like could be used between the surfaces to enhance the thermal connection. Captive fasteners 36 within the housing 12 and accessed through holes in the power terminals V+, V−, MID provide for bolting to the external bus bars, cables, high current PCB, etc.

Figures 26A, 26B:
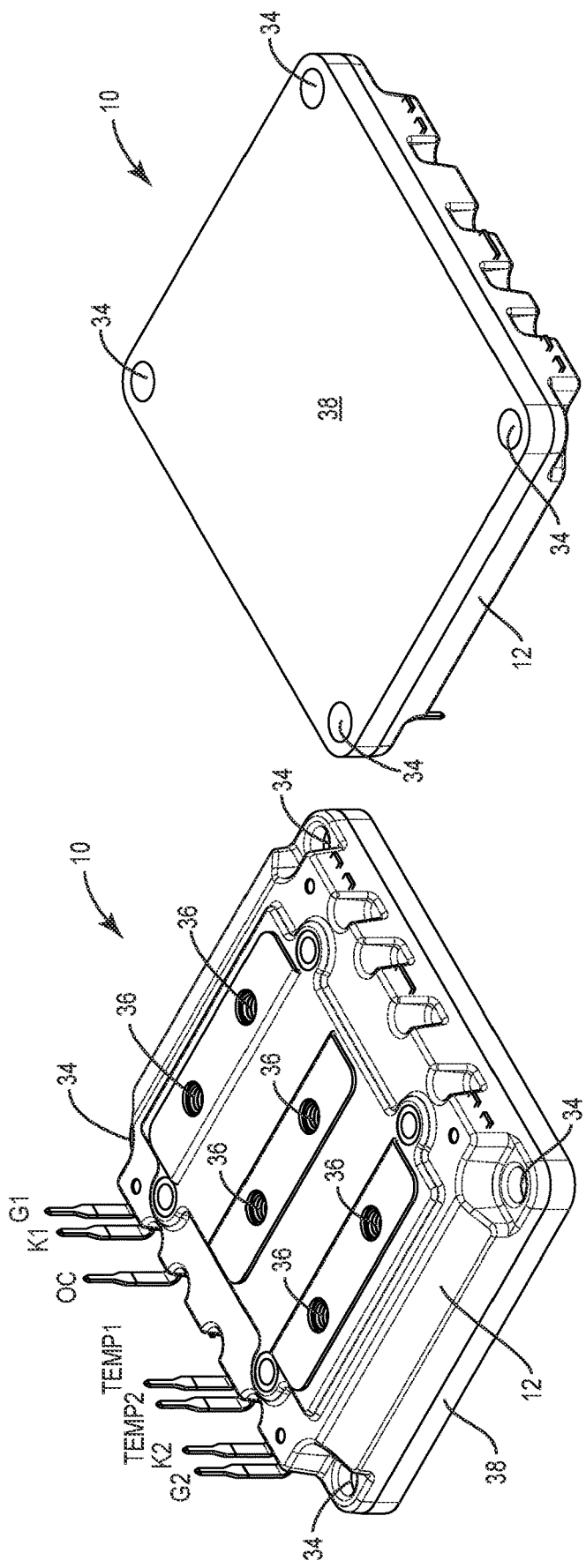
FIG. 26A is an isometric view of a top side of a power module according to a third embodiment of the disclosure.
FIG. 26B is an isometric view of a bottom side of the power module according to the third embodiment of the disclosure.

In other applications, a base plate 38 provided on the bottom of the housing 12 may be desirable, as illustrated in FIGS. 26A and 26B. Base plates 38 provide mechanical support and heat spreading. While base plates 38 add additional thermal layers and interfaces between the heat source and heat sink, they make the product easier to use for users who do not want to solder, sinter, or deal with bolting directly to the housing. Base plates 38 may be formed from metals, metal alloys, or composite materials with a better coefficient of thermal expansion match with the rest of the assembly. Base plates 38 may be attached to the thermal pad 14 with sintered metal, solder, or similar thermally conductive attachment. The housing 12 may be attached to the base plate 38 with adhesive or formed directly over the base plate in a molding process.

Figures 27A, 27B:
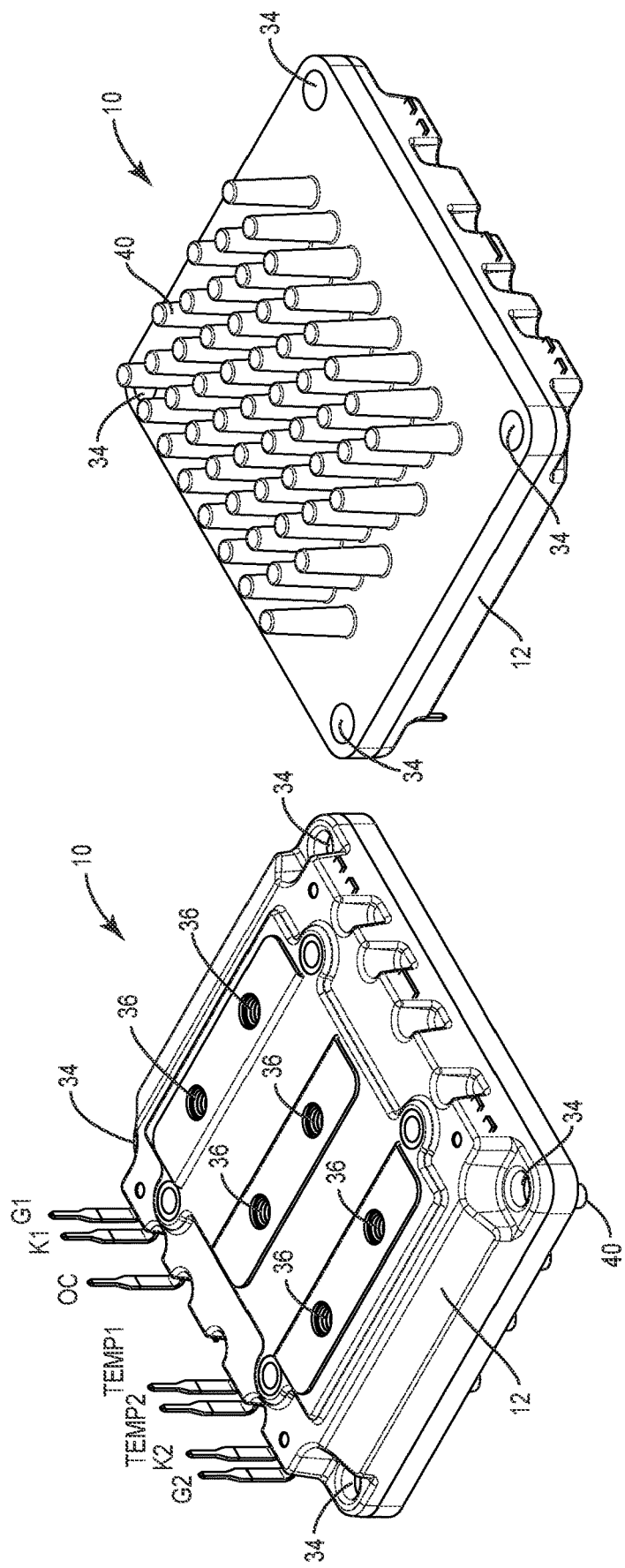
FIG. 27A is an isometric view of a top side of a power module according to a fourth embodiment of the disclosure.
FIG. 27B is an isometric view of a bottom side of the power module according to the fourth embodiment of the disclosure.

The base plate 38 may be enhanced with fins 40 of various shapes and/or sized to compensate for the thermal tradeoff of the additional layer, as illustrated in FIGS. 27A and 27B. Here, there is no tradeoff in thermal performance with or without a base plate. While cylindrical fins 40 are shown, pins of different geometries (i.e. elongated blades, square, rectangular) and patterns are envisioned based on the flow conditions and direction of the cold plate and the coolant material.

Figure 28B:
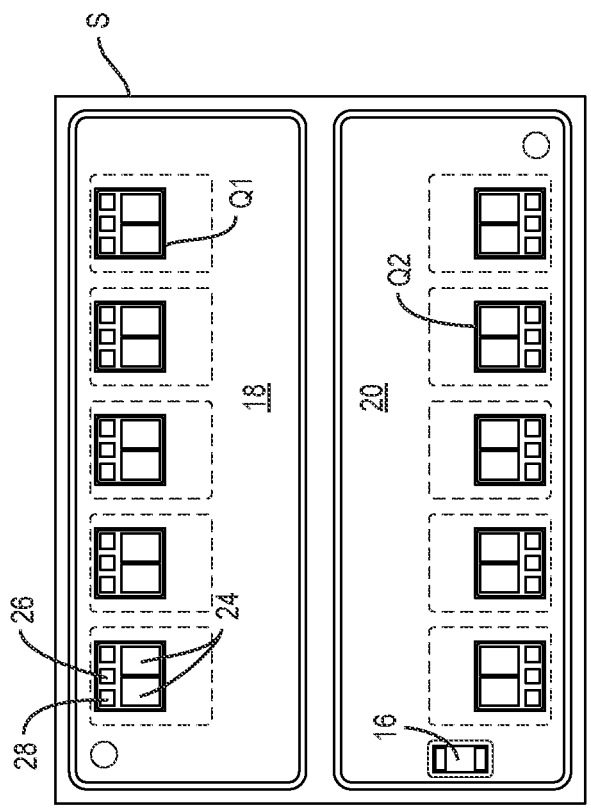
FIGS. 28A and 28B illustrate exemplary embodiments of the power module when used with larger and smaller power devices, respectively.
Figure 28A:
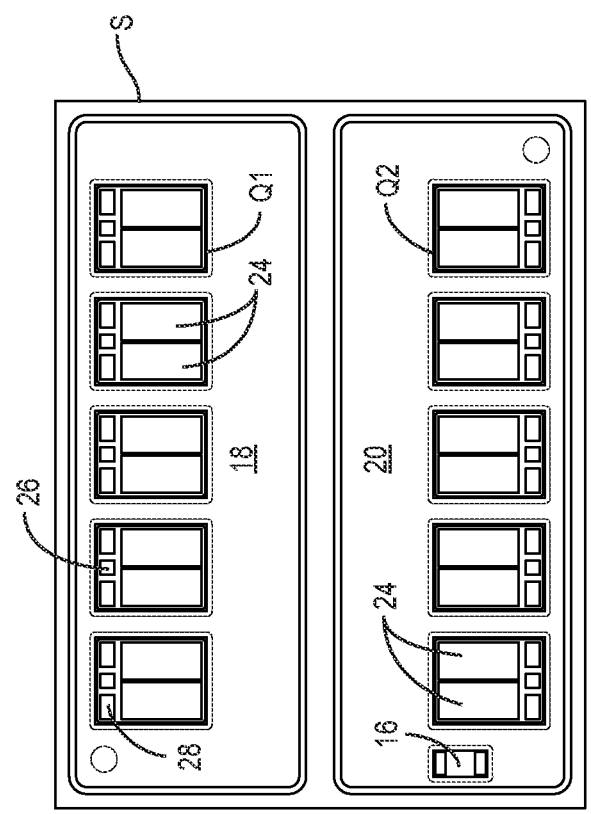

Modularity is a fundamental feature of certain embodiments. Within a given footprint, devices, such as the high-side transistors Q1 and the low-side transistors Q2 of different sizes, can be incorporated as illustrated in FIGS. 28A and 28B. This gives the opportunity to optimize a product variant to use the exact amount of semiconductor area needed for a given system and operational conditions. This is beneficial, as often the device area is the most expensive part of the module, so using the right amount of material is key to keep costs down.

Figure 29B:
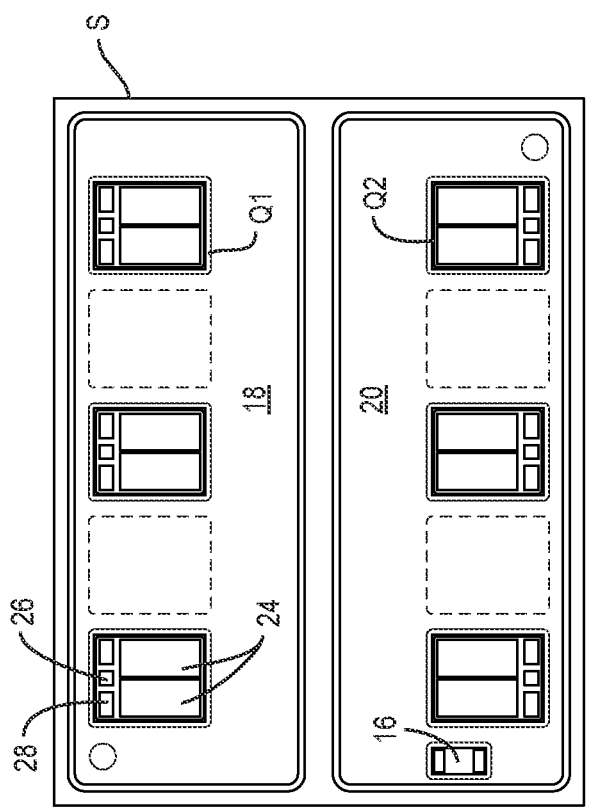
FIGS. 29A and 29B illustrate exemplary embodiments of the power module when fully populated and partially populated, respectively.
Figure 29A:
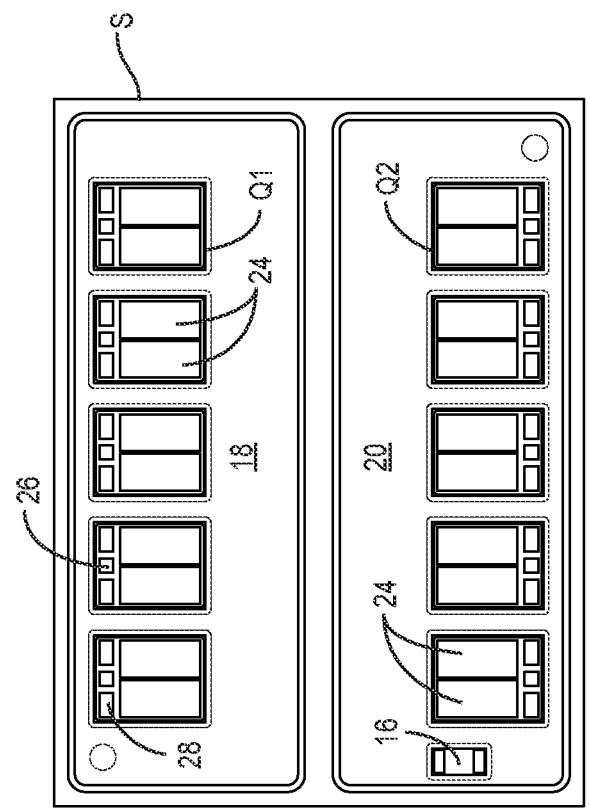

For further customization, a transistor position may be fully populated, in which all possible sites are filled with the power module 10 in one embodiment and be de-populated, in which only some of the possible sites are filled in another embodiment. This is also a useful technique to adjust device area for a given application, having an additional benefit of not having to develop or manufacture a new custom device. An example of this is illustrated in FIG. 29A wherein each site is populated and FIG. 29B wherein only three of the five sites are populated.

Figure 30B:
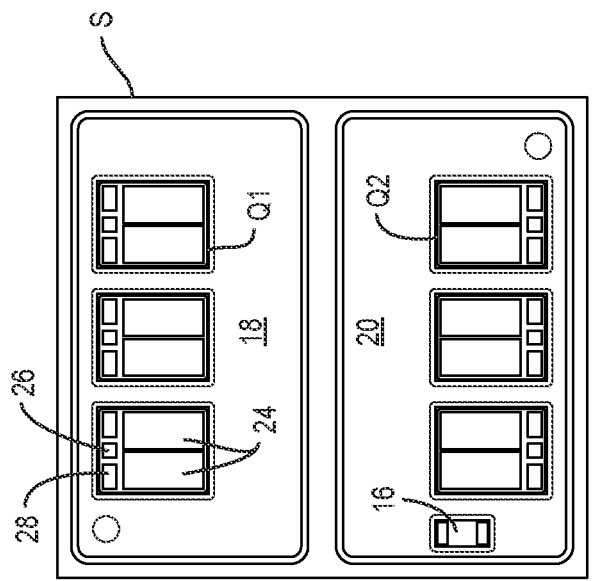
FIGS. 30A and 30B illustrate exemplary embodiments of the substrate of the power module when laterally scaled for larger and smaller configurations, respectively.
Figure 30A:
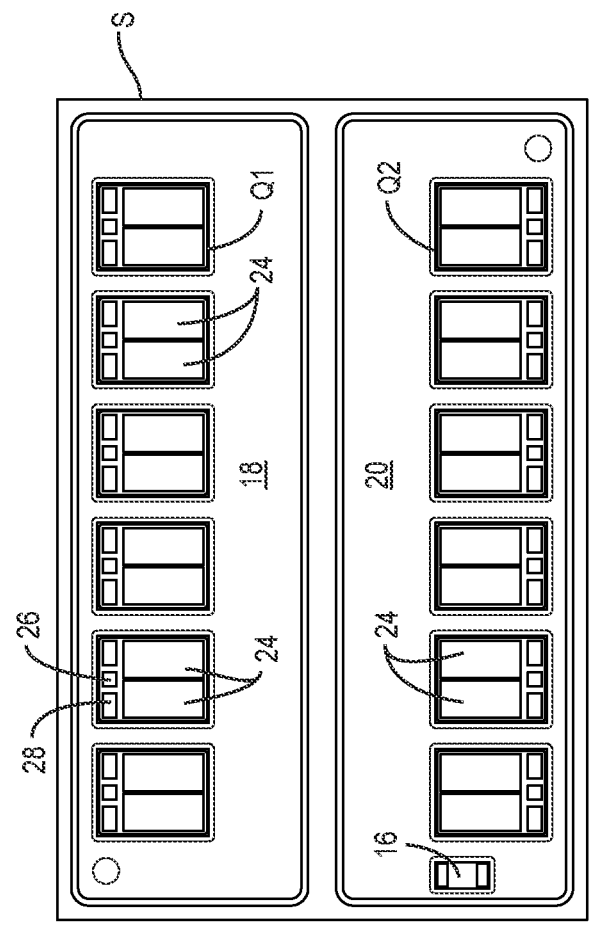
Figure 31B:
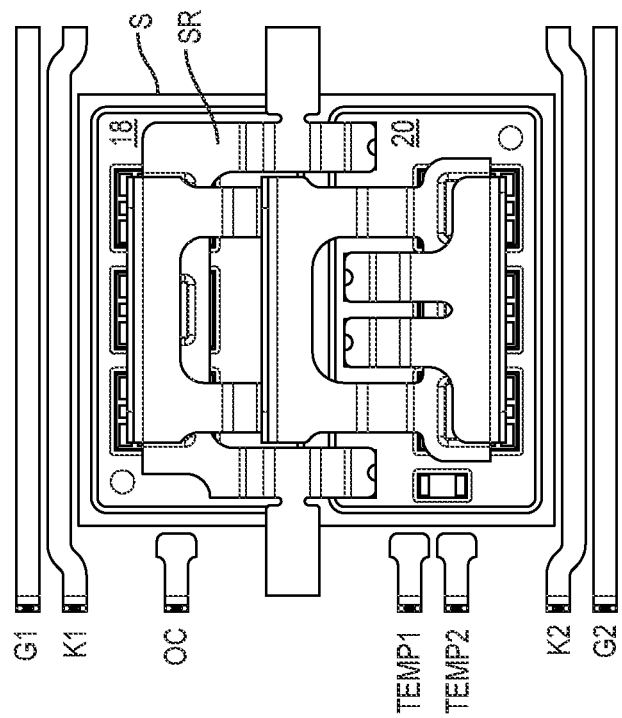
FIGS. 31A and 31B illustrate exemplary embodiments of the substrate of the power module when laterally scaled for larger and smaller configurations, respectively, wherein the signal terminals, power terminals, and the source rail are depicted.
Figure 31A:
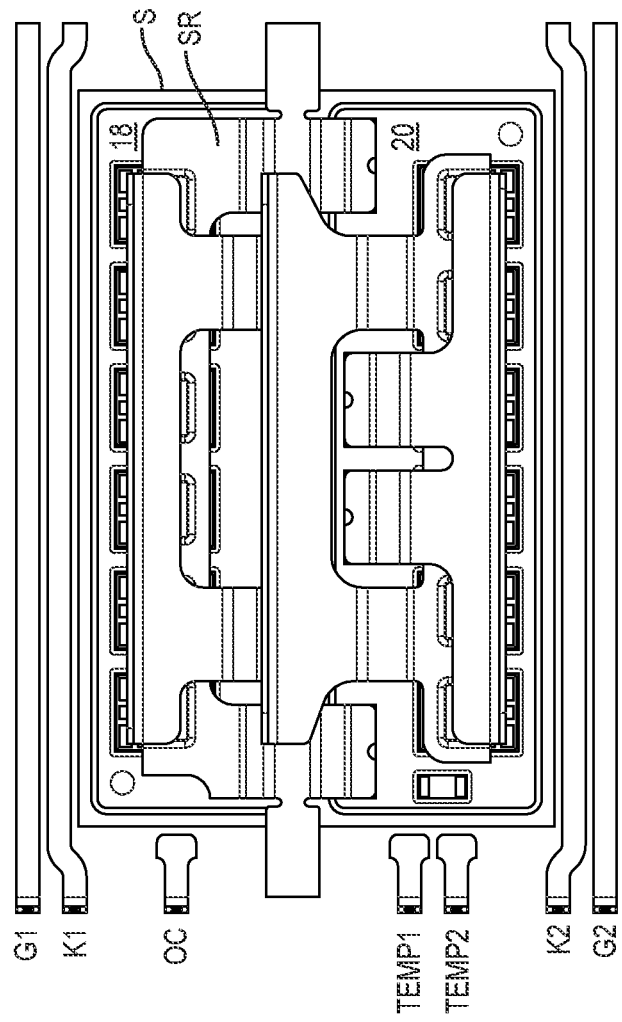
Figure 32B:
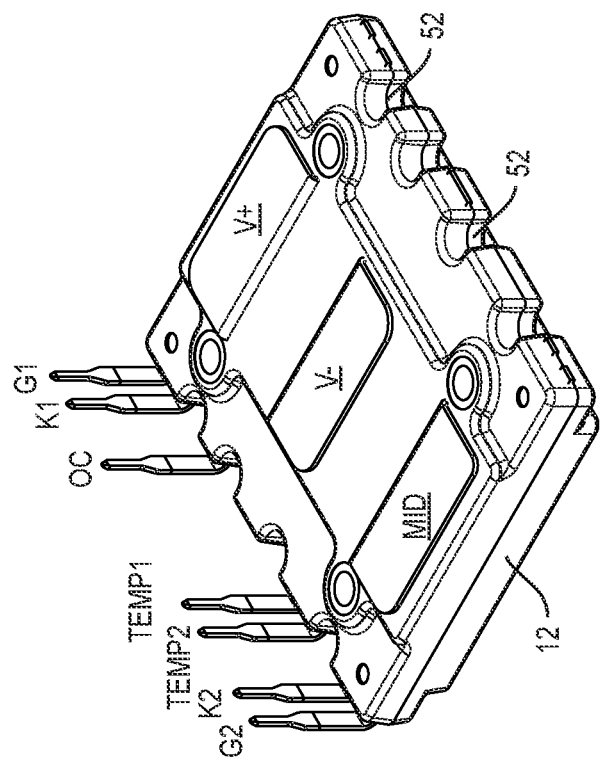
FIGS. 32A and 32B illustrate exemplary embodiments of the substrate of the power module when laterally scaled for larger and smaller configurations, respectively, wherein the housing is depicted.
Figure 32A:
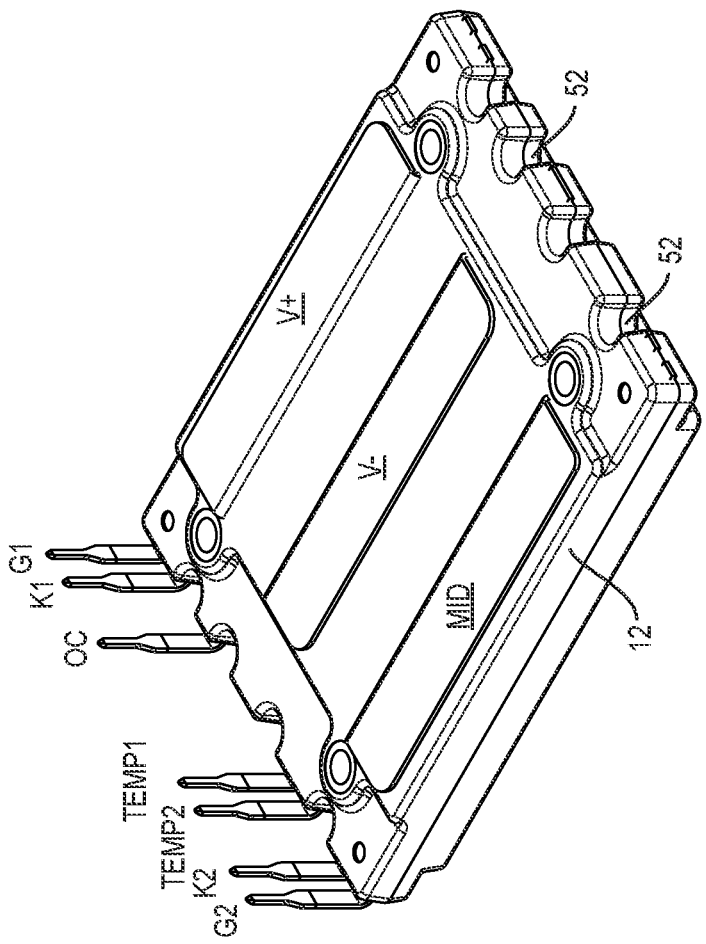

In addition to being highly modular, the layout is scalable to be as compact as possible for any arbitrary device size and count. This parametric scalability gives the product designer many variables to adjust to streamline thermal performance and product size. Lateral scaling the device size is illustrated in FIGS. 30A and 30B, but scaling along both axes is envisioned. As the power module 10 scales up or down, the areas of the power terminals V+, V−, MID scale accordingly. This is another beneficial feature, as the current will be vary based on total device area. Wider power terminals V+, V−, MID dynamically scale to properly carry current without excessive resistive losses, as illustrated without the housing 12 in FIGS. 31A and 31B and with the housing 12 in FIGS. 32A and 32B. These techniques help ensure that the effective current paths to each paralleled device are practically equalized.

The height of the power module 10 can scale up or down as well to adjust to the voltage creepage and clearance requirements of a system or application. In general, the height should be kept as low as possible to minimize power loop inductance. Using some or all of the modularity and scalability techniques described allows for a wide range of product derivatives to be conceived to best meet the needs of many specific systems and power levels.

Current must flow through a closed circuit. Accordingly, the stray inductance of the power module 10 is not the only contributing factor to the full loop inductance that will result in voltage overshoot. The full loop, including the DC-link capacitor, bussing or wiring, and the power module 10 itself must be considered. As such, not only does the internal layout of the power module 10 need to be low inductance, but the external terminal locations must also allow for low inductance laminated bussing or similar interconnection method to connect the product to the DC supply.

Figures 33A, 33B:
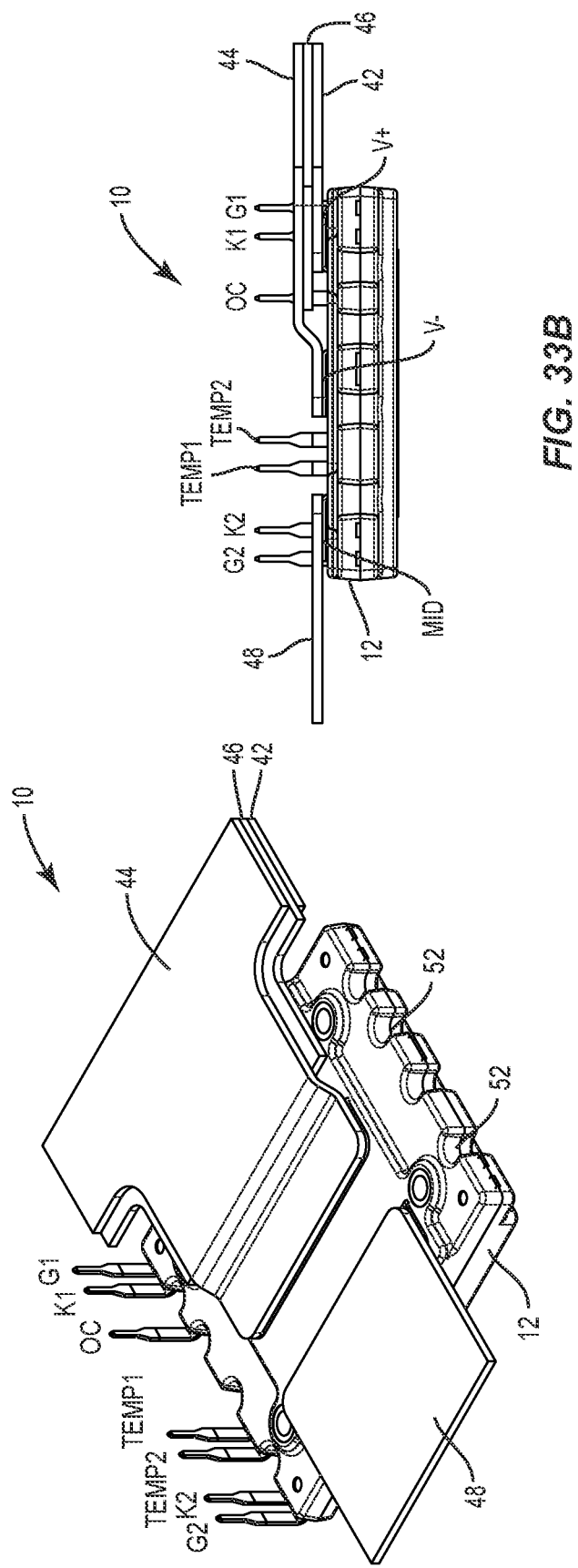
FIGS. 33A and 33B are top isometric and side views of the power terminals of the power module connected to bus bars according to a first embodiment.

In one embodiment, the power module 10 is configured such that the bussing brought to the module is practically ideal. FIGS. 33A and 33B illustrate a virtually ideal configuration wherein V+ bus bar 42 and V− bus bar 44 connect to power terminal V+ and power terminal V−, respectively, and laminated together with a thin insulative layer 46 formed from an electrically insulating material between them. As current is flowing in opposing directions through these layers, their magnetic fields cancel out resulting in a minimal effective inductance. A MID bus bar 48 is also depicted as being connected to the power terminal MID.

The connection from the V+, V−, and MID bus bars 42, 44, 48 to the respective power terminals V+, V−, and MID may be welded. Physical access may need to be available for the weld tooling or visual access for laser or electron beam welding. This can be accomplished by welding the first layer down separately, then stacking the second layer on top and welding it next. One or both of these layers may have the insulation, depending on the system. The insulation could be a laminated film, over-molded plastic, or similar depending on the system.

Figure 34B:
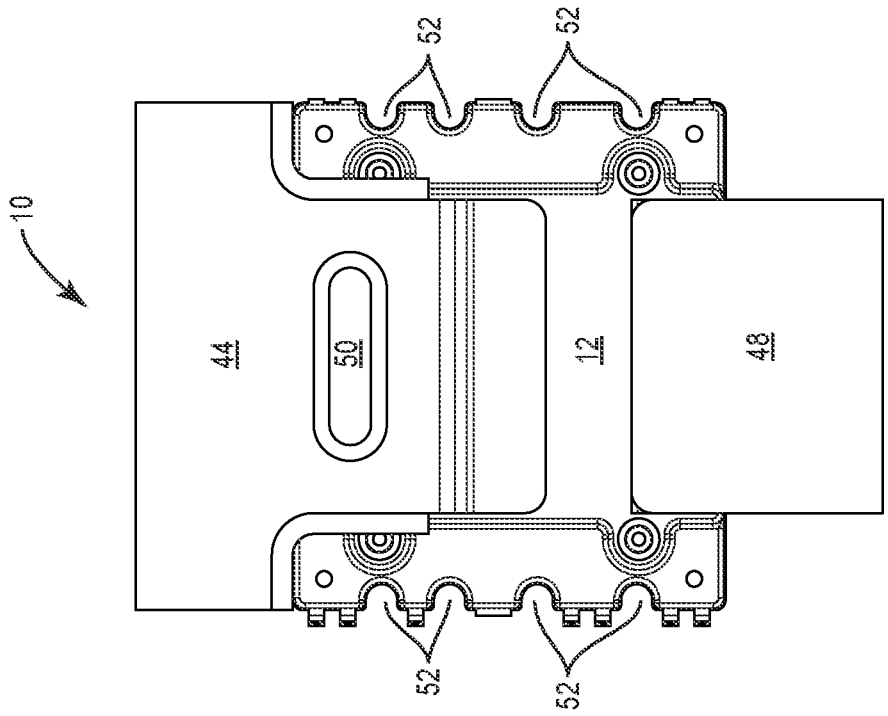
FIGS. 34A and 34B are top isometric and side views of the power terminals of the power module connected to bus bars according to a first embodiment.
Figure 34A:
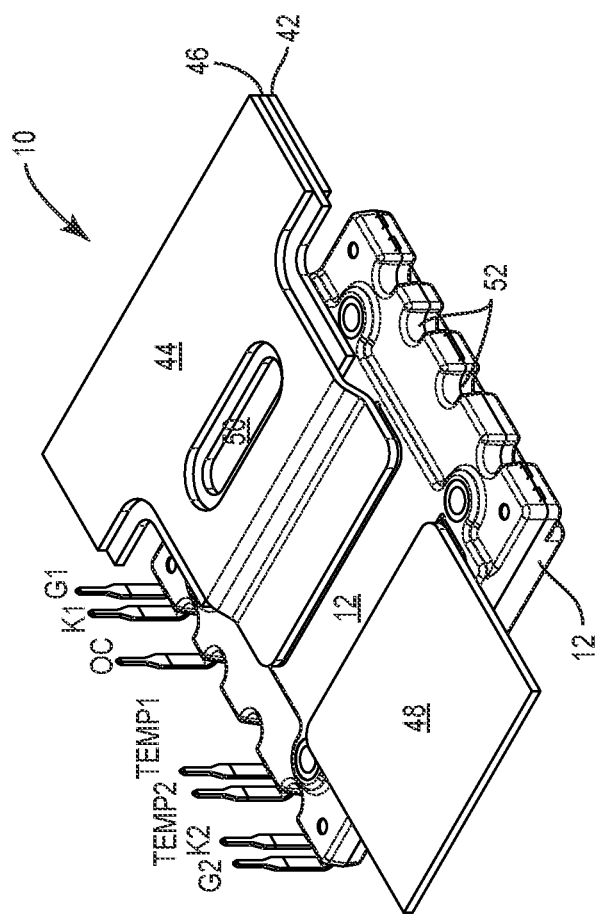

Alternatively, if the bus bar assembly is desired to be a single unit, an opening 50 could be cut out of the upper layer to provide access to the lower welding point. While this is not recommended due to the performance tradeoff, it could find use in some situations. An embodiment with an opening 50 that extends through the V+ and V− bus bars 42, 44 and the insulative layer 46 is depicted in FIGS. 34A and 34B.

Figure 35:
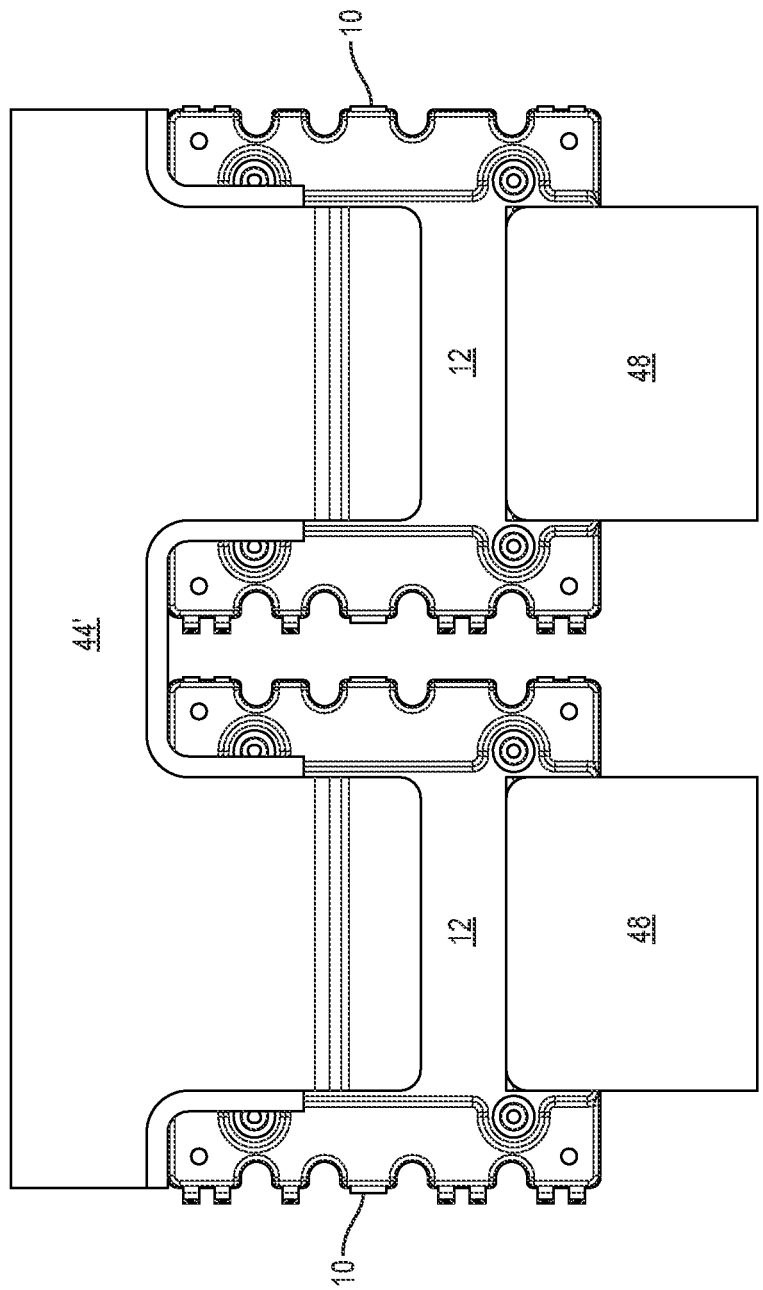
FIG. 35 illustrates power modules arranged as a full-bridge topology according to one embodiment of the present disclosure.

Multiple half-bridge power modules 10 can be arranged and interconnected into a variety of power conversion topologies. FIG. 35 illustrates a full-bridge configuration, in which the two half-bridge power modules 10 share common connections to the power terminals V+ and V− using a single V+ bus bar (not shown) and a single V− bus bar 44' with individual isolated outputs provided by the two individual MID bus bars 48. Full-bridges are useful in applications including DC-DC converters and power supplies.

Figure 36:
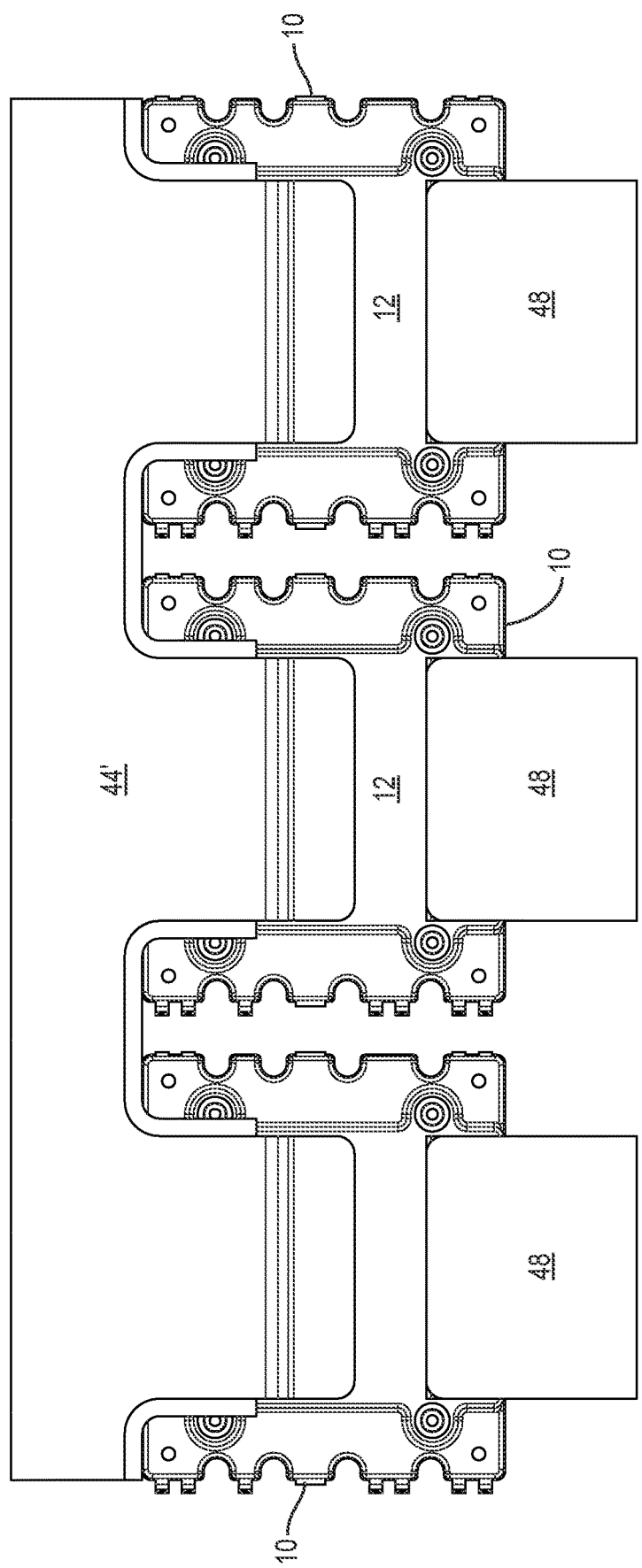
FIG. 36 illustrates power modules arranged as a three-phase topology according to one embodiment of the present disclosure.

The half-bridge power modules 10 can also be arranged as a three-phase configuration, as illustrated in FIG. 36. Here, the three half-bridge power modules 10 share a common connection to the power terminals V+ and V− using a single V+ bus bar (not shown) and a single V− bus bar 44' with three individual isolated outputs provided by the MID bus bars 48. Three-phase topologies find use in three phase motor drives and inverters.

Figure 37:
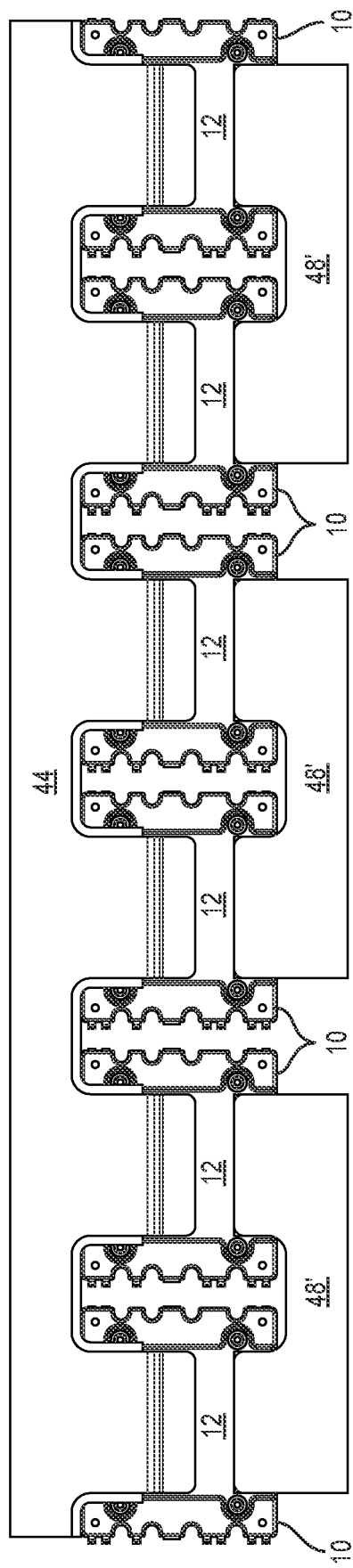
FIG. 37 illustrates power modules arranged as a higher power three-phase topology according to one embodiment of the present disclosure.

For any arrangement, half-bridge, full-bridge, three-phase, and the like, the half-bridge power modules 10 may be paralleled themselves to increase the output current. Each power module 10 shares a common connection to the power terminals V+ and V− using a single V+ bus bar (not shown) and a single V− bus bar 44'. Each pair of power modules 10 use a single MID bus bar 48' to connect the power terminals MID. An example of a paralleled arrangement for a three-phase topology is shown in FIG. 37.

One could conceive of many further arrangements of the half-bridge modules depending on the constraints of a given system. Ultimately, the flexibility of the power module 10 to be internally or externally configured to best meet the needs of power conversion systems of many voltage and current classes allows for many customized and optimized solutions.

The concepts provided above, address one, some, or all of the above to provide a unique and novel power module 10. Those skilled in the art will recognize improvements and modifications to the present disclosure. All such improvements and modifications are considered within the scope of the concepts disclosed herein.

What is claimed is:

1. A power module comprising:
a substrate comprising a top side with a first device pad and a second device pad;
a first plurality of vertical power devices electrically and mechanically coupled to the first device pad via first drain contacts and a second plurality of vertical power devices electrically and mechanically coupled to the second device pad via second drain contacts to form part of a power circuit;
a housing for the substrate, the first plurality of vertical power devices, and the second plurality of vertical power devices, the housing comprising a top surface, a bottom surface, and four sides extending between and perpendicular to the top surface and the bottom surface;
a first power terminal extending through the top surface of the housing to the first device pad;
a second power terminal extending through the top surface of the housing to source contacts on a top side of the second plurality of vertical power devices; and
a third power terminal extending through the top surface of the housing to the second device pad.

2. The power module of claim 1 further comprising a source rail coupled between source contacts on a top side of the first plurality of vertical power devices and the second device pad.

3. The power module of claim 2 further comprising:
a first gate signal terminal extending into the housing and electrically coupled to gate contacts of the first plurality of vertical power devices; and
a second gate signal terminal extending into the housing and electrically coupled to gate contacts of the second plurality of vertical power devices.

4. The power module of claim 3 further comprising:
a first source-kelvin signal terminal extending into the housing and electrically coupled to source-kelvin contacts of the first plurality of vertical power devices; and
a second source-kelvin signal terminal extending into the housing and electrically coupled to source-kelvin contacts of the second plurality of vertical power devices.

5. The power module of claim 4 wherein the first gate signal terminal, the second gate signal terminal, the first source-kelvin signal terminal, and the second source-kelvin signal terminal extend into the housing through a first side of the housing, wherein the first side of the housing extends along and is perpendicular to the top surface of the housing.

6. The power module of claim 5 further comprising a temperature circuit on the substrate, a first temperature signal terminal that extends through the first side of the housing to the temperature circuit, and a second temperature signal terminal that extends through the first side of the housing to the temperature circuit.

7. The power module of claim 6 wherein the temperature circuit is provided on at least one of the first device pad and the second device pad.

8. The power module of claim 6 further comprising an over-current signal terminal that extends though the first side of the housing and is electrically coupled to the first device pad.

9. The power module of claim 1 further comprising:
a first gate signal terminal extending into the housing and electrically coupled to gate contacts of the first plurality of vertical power devices via first bond wires;
a second gate signal terminal extending into the housing and electrically coupled to gate contacts of the second plurality of vertical power devices via second bond wires;
a first source-kelvin signal terminal extending into the housing and electrically coupled to source-kelvin contacts of the first plurality of vertical power devices via third bond wires; and
a second source-kelvin signal terminal extending into the housing and electrically coupled to source-kelvin contacts of the second plurality of vertical power devices via fourth bond wires, wherein the first gate signal terminal, the second gate signal terminal, the first source-kelvin signal terminal, and the second source-kelvin signal terminal extend into the housing through a first side of the housing, wherein the first side of the housing extends along and is perpendicular to the top surface of the housing.

10. The power module of claim 9 wherein the first gate signal terminal and the first source-kelvin signal terminal are adjacent one another to form a first group, the second gate signal terminal and the second source-kelvin signal terminal are adjacent one another and spaced apart from the first gate signal terminal and the first source-kelvin signal terminal to form a second group.

11. The power module of claim 10 wherein at least one additional signal terminal is provided between the first group and the second group.

12. The power module of claim 11 wherein at least one notch is provided in the first side of the housing between the first group and the second group.

13. The power module of claim 11 wherein a plurality of notches is provided in the first side of the housing between the first group and the second group.

14. The power module of claim 1 wherein the first power terminal, the second power terminal, and the third power terminal each have a portion that extends outside of the housing and is parallel with the top surface of the housing.

15. The power module of claim 1 further comprising a thermal pad on a bottom side of the substrate, wherein the thermal pad is exposed through the bottom surface of the housing.

16. The power module of claim 15 further comprising a base plate on the bottom side of the substrate and thermally coupled to the thermal pad.

17. The power module of claim 16 wherein the thermal pad comprises a plurality of fins.

18. The power module of claim 1 wherein each of the first plurality of vertical power devices is coupled in parallel with the others, and the second plurality of vertical power devices is coupled in parallel with one another.

19. The power module of claim 1 wherein:
the first power terminal comprises first plurality of legs that extend to the first device pad;
the second power terminal comprises a second plurality of legs that extend to the source contacts on the top side of the second plurality of vertical power devices; and
the third power terminal comprises a third plurality of legs that extend to the second device pad.

20. The power module of claim 1 wherein the power circuit is a half-bridge circuit.

21. The power module of claim 1 wherein the first plurality of vertical power devices and the second plurality of vertical power devices comprise vertical field effect transistors.

22. The power module of claim 21 wherein the vertical field effect transistors are silicon carbide field effect transistors.

23. The power module of claim 1 wherein the top surface of the housing comprises a plurality of ledges that function as creepage extenders to effectively extend a surface distance between certain conductive elements of the power module.

24. The power module of claim 1 wherein the housing is a molded housing.

25. A power module comprising:
a substrate comprising a top side with a first device pad and a second device pad;
a first plurality of vertical power devices electrically and mechanically coupled to the first device pad via first drain contacts and a second plurality of vertical power devices electrically and mechanically coupled to the second device pad via second drain contacts to form part of a power circuit;
a housing comprising a top surface, a bottom surface, and four sides extending between and perpendicular to the top surface and the bottom surface, wherein the substrate, the first plurality of vertical power devices, and the second plurality of vertical power devices are within the housing;
a first power terminal extending through the top surface of the housing to the first device pad;
a second power terminal extending through the top surface of the housing to source contacts on a top side of the second plurality of vertical power devices;
a third power terminal extending through the top surface of the housing to the second device pad;
a source rail coupled between source contacts on a top side of the first plurality of vertical power devices and the second device pad; and
a plurality of signal terminals that extend into the housing through one of the four sides of the housing and are coupled to certain ones of the first plurality of vertical power devices and the second plurality of vertical power devices via bond wires.

* * * * *